(12) United States Patent
Masayoshi et al.

(10) Patent No.: US 6,714,602 B1
(45) Date of Patent: Mar. 30, 2004

(54) DEMODULATOR AND RECEIVER

(75) Inventors: Abe Masayoshi, Tokyo (JP); Yukitoshi Sanada, Tokyo (JP); Dragan Krupezvic, Stuttgart (DE); Veselin Brankovic, Fellbach (DE)

(73) Assignees: Sony Corporation (JP); Sony International (Europe) G.m.b.H. (JP)

( * ) Notice: Subject to any disclaimer, the term of this patent is extended or adjusted under 35 U.S.C. 154(b) by 0 days.

(21) Appl. No.: 10/149,209
(22) PCT Filed: Oct. 12, 2000
(86) PCT No.: PCT/JP00/07080
§ 371 (c)(1),
(2), (4) Date: Oct. 4, 2002
(87) PCT Pub. No.: WO02/31965
PCT Pub. Date: Apr. 18, 2002

(51) Int. Cl.$^7$ .................................................. H03D 3/08
(52) U.S. Cl. ........................................................... 375/322
(58) Field of Search ................................. 375/320, 324, 375/325, 340, 316, 261, 268, 322, 329, 235

(56) References Cited

U.S. PATENT DOCUMENTS

| | | | | |
|---|---|---|---|---|
| 4,829,598 A | * | 5/1989 | Auracher et al. | 398/204 |
| 6,337,888 B1 | * | 1/2002 | Huang et al. | 375/322 |

FOREIGN PATENT DOCUMENTS

| | | |
|---|---|---|
| JP | 53-38961 | 4/1978 |
| JP | 54-79551 | 6/1979 |
| JP | 61-230410 | 10/1986 |
| JP | 61-295701 | 12/1986 |
| JP | 2000-68747 | 3/2000 |
| JP | 2000-183994 | 6/2000 |
| JP | 2000-196693 | 7/2000 |

OTHER PUBLICATIONS

Publication: IEE Transactions on Microwave Theory and Techniques, vol. 44, No. 1. Jan. 1996.
Title: Dual–Tone Calibration of Six–Port Junction and It's Application to the Six–Port Direct Digital Millimetric Receiver.
By: Ji Li, Renato G. Bosisio, Fellow, IEEE, and Ke Wu, Senior Member, IEEE.

* cited by examiner

Primary Examiner—Emmanuel Bayard
(74) Attorney, Agent, or Firm—Rader, Fishman & Grauer PLLC; Ronald P. Kananen

(57) ABSTRACT

A high performance demodulator, capable of realizing further broadband characteristics, low distortion, a low power consumption, and small fluctuation in characteristics against fluctuations in temperature and fluctuations over time compared with a conventional multi-port demodulators, wherein a two-terminal first phase shifter 1004, three-terminal second branch circuit 1002, two-terminal second phase shifter 1005, and three-terminal third branch circuit 1003 are connected in series between a first signal input terminal TINSr for a reception signal and a second signal input terminal TINSlo for a local signal, a third terminal c of a first branch circuit 1001 is connected to a first power detection circuit 1006, a third terminal c of the second branch circuit 1002 is connected to a second power detection circuit 1007, and a third terminal c of the third branch circuit 1003 is connected to a third power detection circuit 1008, and comprising an N-port signal-IQ signal conversion circuit 1009 for receiving output signals P1, P2, and P3 of the first to third power detection circuits 1006 to 1008 and converting the same to demodulation signals, that is, in-phase signal I(t) and a quadrature signal Q(t), by a computation circuit.

61 Claims, 15 Drawing Sheets

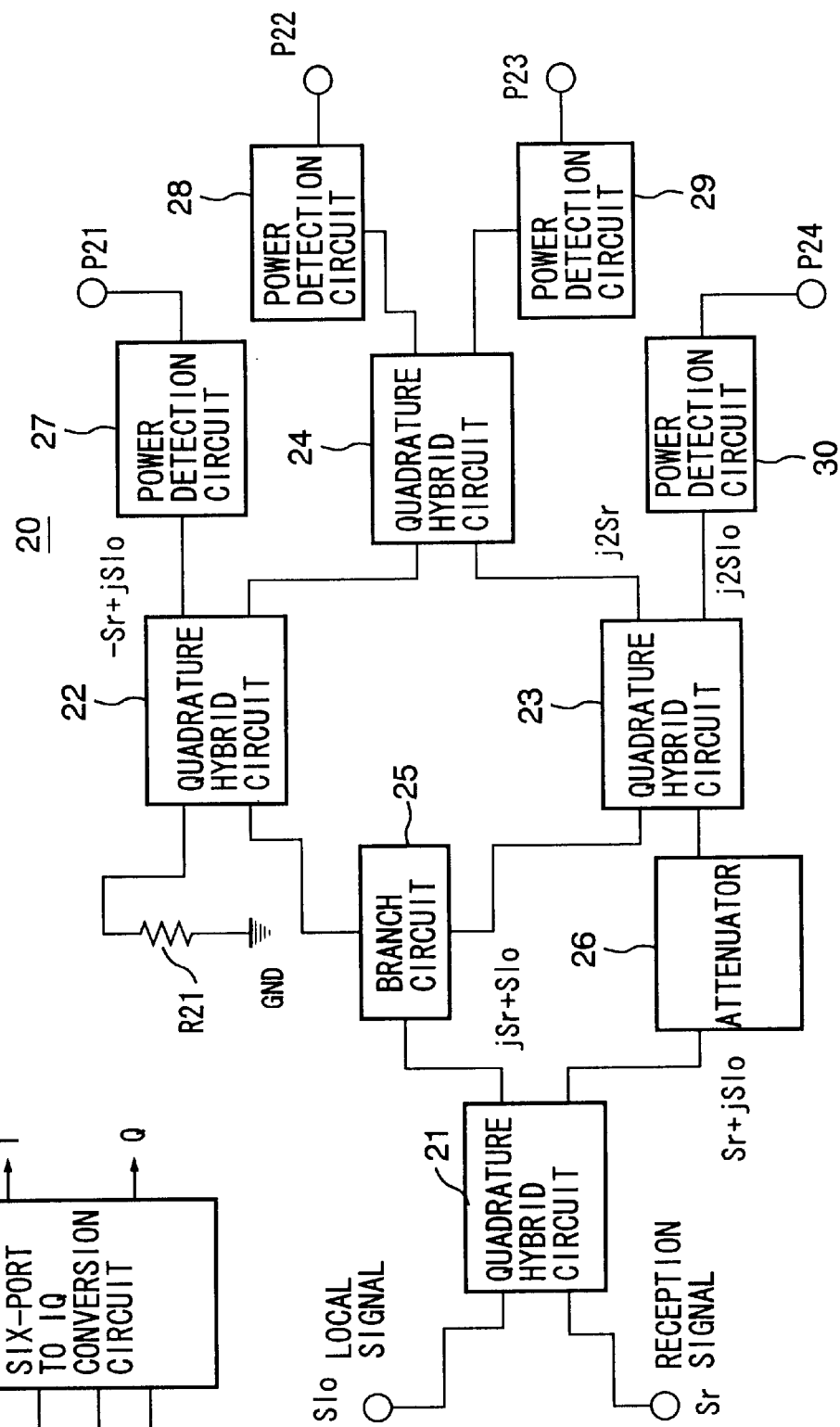
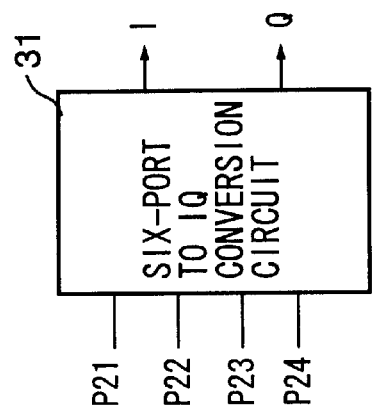

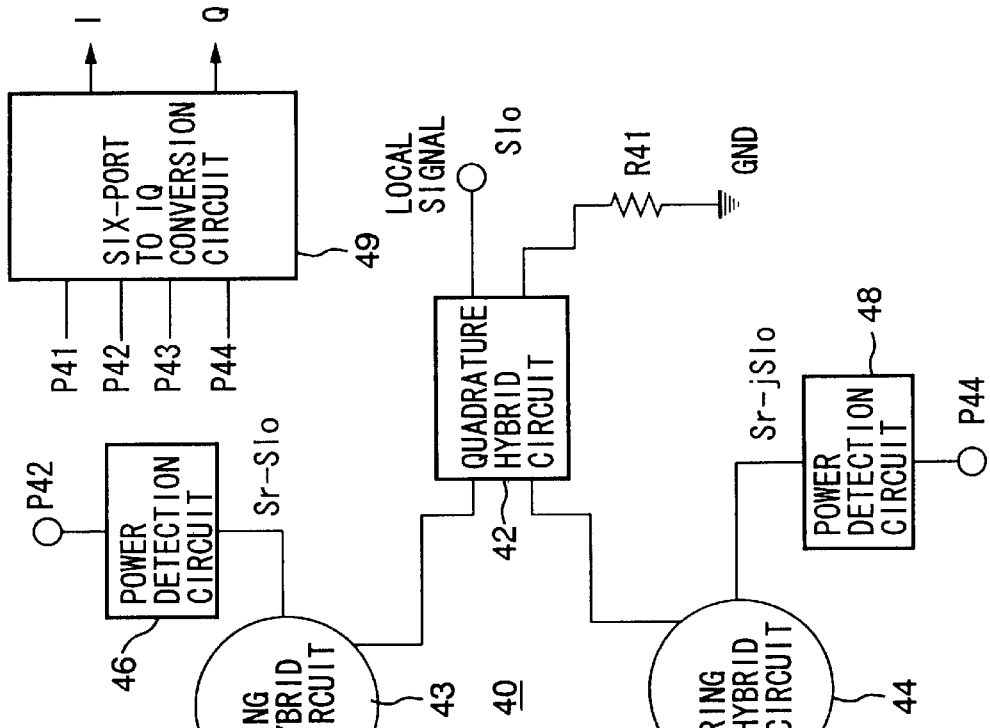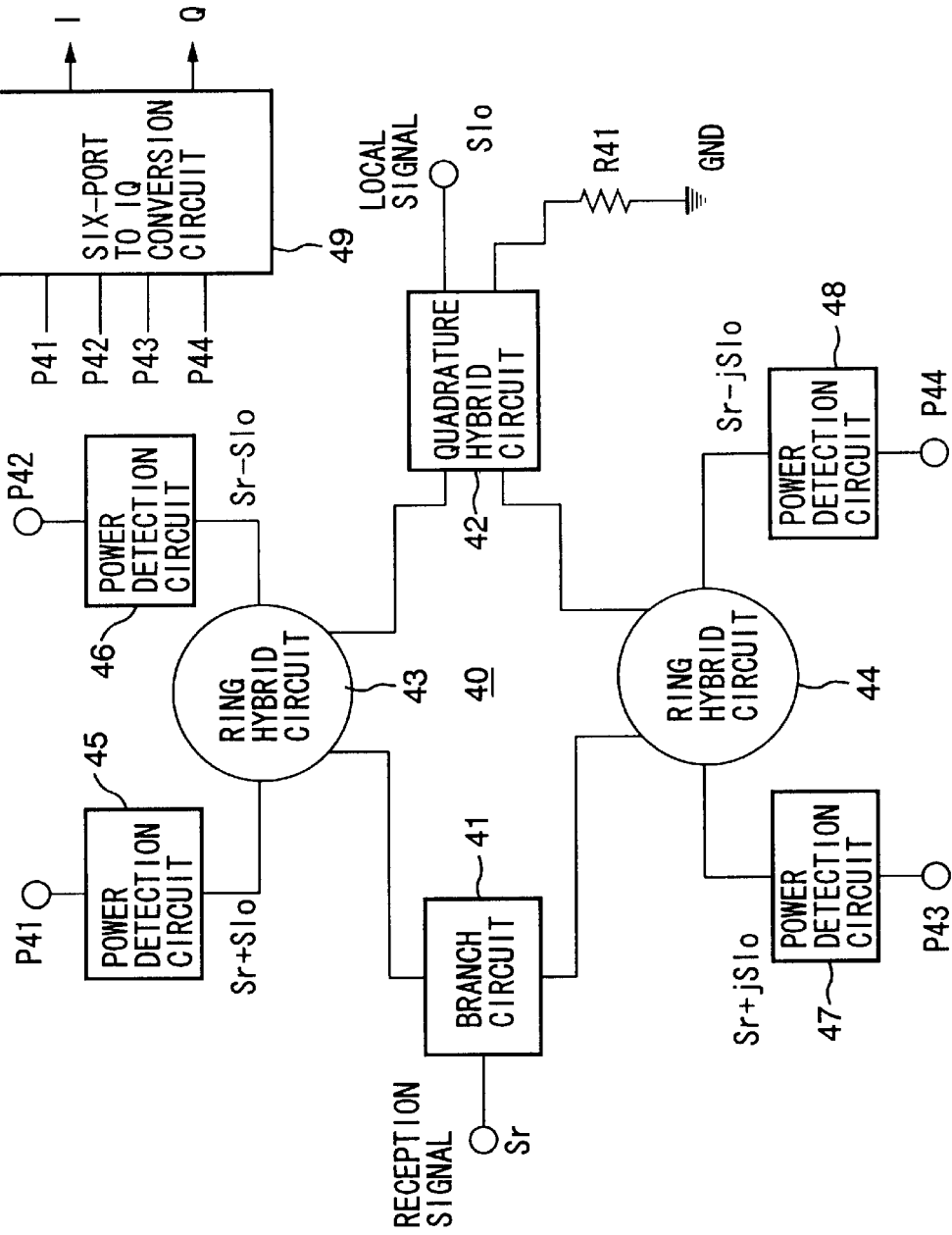

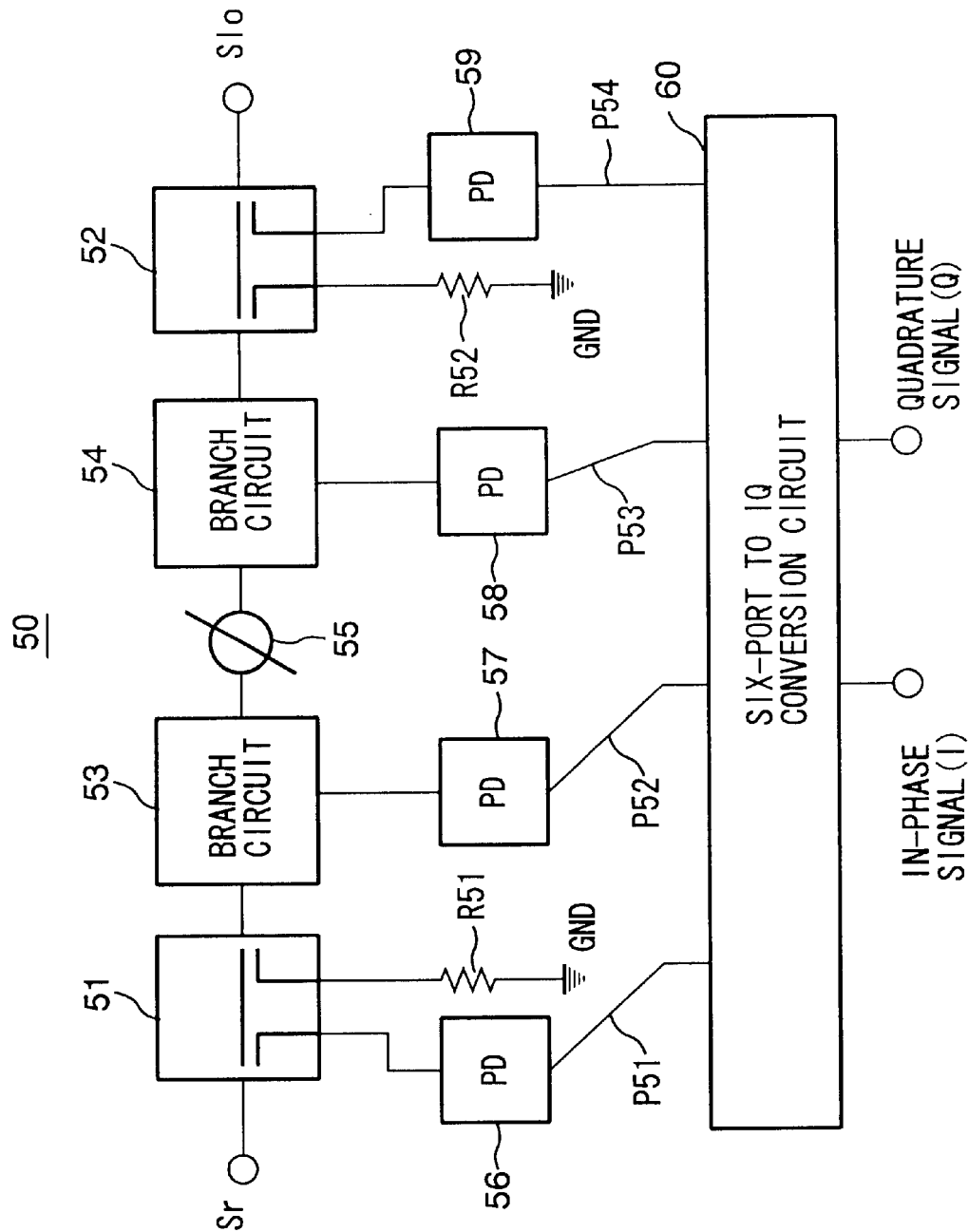

डेmodulator AND RECEIVER

TECHNICAL FIELD

The present invention relates to a demodulator of a direct conversion system effective for impedance measurement in a high frequency band such as the GHz band used in for example communication apparatuses for sending and receiving high frequency signals etc. and a receiver using the same.

BACKGROUND ART

FIG. 1 is a circuit diagram of the configuration of a key portion of a general demodulator.

As shown in FIG. 1, a demodulator 10 comprises as main components a local signal generation circuit 11, +45 degree phase shifter 12, −45 degree phase shifter 13, and RF mixers 14 and 15.

In the demodulator 10, a local signal Slo having a predetermined frequency generated by the local signal generation circuit 11 is shifted in phase by 45 degrees by the +45 degree phase shifter 12 to be supplied to the RF mixer 14 and is shifted by −45 degrees by the −45 degree phase shifter 13 to be supplied to the RF mixer 15.

Further, a reception signal Sr, for example, passed through a not shown antenna element or a low noise amplifier is supplied to the RF mixers 14 and 15, the reception signal Sr and the local signal shifted in phase by exactly +45 degrees are multiplied at the RF mixer 14 to obtain an in-phase signal (I), and the reception signal Sr and the local signal shifted in phase by exactly −45 degrees are multiplied in the RF mixer 15 to obtain a quadrature signal (Q).

In the demodulator 10 using a mixer as shown in FIG. 1, however, use for broadband applications is difficult, and it is necessary to apply a high local level to the mixer. Further, since the mixer is in a nonlinear operating state by high local power, there is a disadvantage that it is difficult to attain low distortion demodulation.

Therefore, in recent years, a six-port type demodulator (multi-port demodulator) using a power detection circuit (power detector) and based on a different principle from that in FIG. 1 has been proposed.

A six-port type demodulator can more easily be used for broadband applications due to the power detection circuit compared with the mixer used in the above modulation system. From this, it can be the that a multi-port demodulator has good compatibility with software radio requiring multiband or broadband characteristics. Further, there has been a tendency to use higher frequencies as the carrier frequency in wireless communication in recent years, so it is possible to deal with demands for higher frequencies as well.

Further, in a demodulation system using a mixer, a high local level has to be applied to the mixer. As opposed to this, in the multi-port system, the power detection circuit operates in a linear region. Accordingly, with the multi-port system, demodulation is possible even with a low local signal power.

Furthermore, with a demodulation system using a mixer, the mixer is in a nonlinear operating state due to the high local power. As opposed to this, with the multi-port system, the power detection circuit operates in a linear region. Accordingly, the multi-port system enables low distortion demodulation.

Below, three examples of the six-port demodulator will be explained with reference to FIG. 2 to FIG. 4.

FIG. 2A is a block diagram of a first example of the configuration of a six-port demodulator. (See Document [1]: Ji Li et al.: "Dual Tone Calibration of Six-port Junction and Its Application to the Six-port Direct Digital Millimetric Receiver", IEEE Trans. On MTT, Vol. MTT-44, No. 1, 1996.)

The six-port demodulator 20 comprises, as shown in FIG. 2A, quadrature hybrid circuits 21 to 24, a branch circuit 25, an attenuator 26, power detection circuits (power detectors) 27 to 30, and a resistance element R21.

In the six-port demodulator 20, a reception signal Sr and a local signal S10 are received at the quadrature hybrid circuit 21 and the signals jSr+Slo and Sr+jSlo are generated. Further, the signal jSr+Sl0 is branched by the branch circuit 25 and supplied to the quadrature hybrid circuits 22 and 23, while the signal Sr+jSl0 is supplied to the quadrature hybrid circuit 23 via the attenuator 26.

In the quadrature hybrid circuit 22, the signals −Sr+jSlo and Sr+jSlo are generated and supplied respectively to the power detection circuit 27 and the quadrature hybrid circuit 24. Further, in the quadrature hybrid circuit 23, the signals j2Sr and j2Slo are generated and supplied to the quadrature hybrid circuit 24 and the power detection circuit 30. The two output signals of the quadrature hybrid circuit 24 are respectively supplied to the power detection circuits 28 and 29.

In the power detection circuits 27 to 30, for example, the envelope curve levels or power levels of the input signals are detected and output as signals P21 to P24, respectively.

The baseband output signals, that is, detection signal P21 to P24, by the power detection circuits 27 to 30 are, as shown in FIG. 2B, input to a multi-port signal-IQ signal conversion circuit 31, where they are converted into the in-phase signal (I) and quadrature signals (Q) included in the reception signal and output.

FIG. 3A is a block diagram of a second example of the configuration of a six-port demodulator. (See Document [2]: Kangasmaa, et.al.: "Six-port Direct Conversion Receiver", European Microwave Conference 1997.)

The six-port demodulator 40 comprises, as shown in FIG. 3A, a branch circuit 41, a quadrature hybrid circuit 42, ring hybrid circuits 43 and 44, power detection circuits (power detectors) 45 to 48, and a resistance element R41.

In the six-port demodulator 40, the reception signal Sr is branched by the branch circuit 41 and supplied to the ring hybrid circuits 43 and 44. Further, the local signal Slo is performed predetermined quadrature processing in the quadrature hybrid circuit 42 and supplied to the ring hybrid circuits 43 and 44.

In the ring hybrid circuit 43, the signals Sr+Slo and Sr−Slo are generated based on the input reception signal and the local signal and supplied respectively to the power detection circuits 45 and 46. Further, in the ring hybrid circuit 44, the signals Sr+jSlo and Sr−jSlo are generated based on the input reception signal and the local signal and supplied respectively to the power detection circuits 47 and 48.

Then, in the power detection circuits 45 to 48, for example, the envelope curve levels or power levels of the input signals are detected and output as the signals P41 to P44, respectively.

The baseband output signals, that is, detection signals P41 to P44, by the power detection circuits 45 to 48 are, as shown in FIG. 3B, input to a multi-port signal-IQ signal conversion circuit 49, where they are converted into the in-phase signal (I) and quadrature signal (Q) included in the reception signal and output.

FIG. 4 is a block diagram of a third example of the configuration of a six-port demodulator. (See Document [3]: EP97122438.1 (Dec. 18, 1997).)

The six-port demodulator 50 comprises couplers 51 and 52, branch circuits 53 and 54, a phase shifter 55, power detection circuits 56 to 59, resistance elements R51 and R52, and a six-port signal-IQ signal conversion circuit 60.

In the six-port demodulator 50, a reception signal Sr is input by the coupler 51 to the branch circuit 53 and a part thereof is input to the power detection circuit 56. The reception signal input to the branch circuit 53 is branched into two signals. One of the branched signals is input to the power detection circuit 57, while the other signal is input to the phase shifter 55. In the phase shifter 55, a phase shift θ is given to the reception signal by the branch circuit 53, the phase shifted signal is input to the branch circuit 54, and branched into two signals there. In the branch circuit 54, one of the branched signals is input to the power detection circuit 58 and the other signal is input to the coupler 52.

Further, the local signal Sl0 is input by the coupler 52 to the branch circuit 54, and a part thereof is input to the power detection circuit 59. The local signal input to the branch circuit 504 is branched into two signals. One of the branched signals is input to the power detection circuit 58, while the other signal is input to the phase shifter 55. In the phase shifter 55 a phase shift θ is given to the local signal by the branch circuit 54, the phase shifted signal is input to the branch circuit 53, and branched into two signals there. In the branch circuit 53, one of the branched signals is input to the power detection circuit 57 and the other signal is supplied to the coupler 51.

The power detection circuit 56 is supplied with the reception signal. In the power detection circuit 56, an amplitude component of the supplied signal is detected and supplied as a signal P51 to the conversion circuit 60.

The power detection circuit 57 is supplied with the reception signal and the local signal given a phase shift θ. In the power detection circuit 57, an amplitude component of the supplied signal is detected and supplied as a signal P52 to the conversion circuit 60.

Further, the power detection circuit 58 is supplied with the local signal and a reception signal given a phase shift θ. In the power detection circuit 58, an amplitude component of the supplied signal is detected and supplied as a signal P53 to the conversion circuit 60.

Further, the power detection circuit 59 is supplied with the local signal. In the power detection circuit 59, an amplitude component of the supplied signal is detected and supplied as a signal P54 to the conversion circuit 60.

Then, in the conversion circuit 60, the input signals are converted into the demodulation signals, that is, in-phase signal (I) and quadrature signal (Q), and output.

However, the above multi-port mode demodulator has the following disadvantages.

Since the multi-port demodulators shown in FIG. 2A and FIG. 3A use quadrature hybrid circuits and ring hybrid circuits, there is room for improvement in terms of broadband characteristics.

Further, since the multi-port demodulator shown in FIG. 4 uses a directional coupler, there is a problem in terms of the broadband characteristics in the same way.

Generally, a directional coupler using a Wheatstone bridge shown in FIG. 5 is used as the directional coupler. The directional coupler in FIG. 5 outputs a signal input from a port PT1 to a port PT3 but does not output a signal input from a port PT2 to the port PT3.

Since the directional coupler is configured only by resistance elements R61 to R64 having resistance values of R0 to R2, there are broadband characteristics.

However, it is necessary that a power detection circuit having a balanced input terminal be connected to the port PT3. Further, a balanced-unbalance conversion circuit is necessary. These circuits become complex in configuration and increase the circuit size. Furthermore, they limit the frequency bandwidth characteristics in some cases.

Further, in the multi-port demodulator shown in FIG. 4, the power detection circuit connected to the coupler and the power detection circuit connected to the branch circuit have different circuit configurations. This causes different fluctuations in detection characteristics due to temperature or individual variations and consequently causes a decline of the demodulation performance.

DISCLOSURE OF INVENTION

The present invention was made in consideration of the above situation and has as an object thereof to provide a demodulator capable of realizing a low power consumption, low distortion, broadband characteristics, and high performance demodulation and a receiver using the same.

A demodulator of a first aspect of the present invention comprises a first signal input terminal for receiving as an input a reception signal; a second signal input terminal for receiving as an input a local signal; a first branch circuit having a first terminal, a second terminal, and a third terminal, wherein the first terminal is connected to the first signal input terminal, branching the reception signal input to the first terminal to a signal to the second terminal and a signal to the third terminal, and branching a signal input to the second terminal to a signal to the first terminal and a signal to the third terminal; a second branch circuit having a first terminal, a second terminal, and a third terminal, branching a signal input to the first terminal to a signal to the second terminal and a signal to the third terminal, and branching a signal input to the second terminal to a signal to the first terminal and a signal to the third terminal; a third branch circuit having a first terminal, a second terminal, and a third terminal, wherein the first terminal is connected to the second signal input terminal, branching the local signal input to the first terminal to a signal to the second terminal and a signal to the third terminal, and branching a signal input to the second terminal to a signal to the first terminal and a signal to the third terminal; a first phase shifter having a first terminal and a second terminal, wherein the first terminal is connected to the second terminal of the first branch circuit and the second terminal is connected to the first terminal of the second branch circuit, and shifting the phases of a signal input from the first terminal and a signal input from the second terminal and outputting them from the second terminal and the first terminal; a second phase shifter having a first terminal and a second terminal, wherein the first terminal is connected to the second terminal of the second branch circuit and the second terminal is connected to the second terminal of the third branch circuit, and shifting the phases of a signal input from the first terminal and a signal input from the second terminal and outputting them from the second terminal and the first terminal; a first signal level detection circuit having an input terminal connected to the third terminal of the first branch circuit and detecting a level of a signal output from the third terminal of the first branch circuit; a second signal level detection circuit having an input terminal connected to the third terminal of the second branch circuit and detecting a level of a signal output from the third terminal of the second branch circuit; and a third signal level detection circuit having an input terminal connected to the third terminal of the third branch circuit and detecting a level of a signal output from the third terminal of the third branch circuit.

Preferably, the demodulator further comprises a conversion circuit for converting an output signal of the first signal level detection circuit, an output signal of the second signal level detection circuit, and an output signal of the third signal level detection circuit to a plurality of signal components contained in a reception signal.

Further, in the demodulator according to the first aspect of the present invention, the conversion circuit comprises a first channel selection means for selecting a desired channel from the output signal of the first signal level detection circuit; a second channel selection means for selecting a desired channel from the output signal of the second signal level detection circuit; a third channel selection means for selecting a desired channel from the output signal of the third signal level detection circuit; and a computation circuit for demodulating an in-phase component signal I and a quadrature component signal Q based on an output signal of the first channel selection means, an output signal of the second channel selection means, an output signal of the third channel selection means, and a predetermined circuit parameter constant.

Further, the computation circuit obtains an in-phase component signal I and a quadrature component signal Q by computation based on the following equations:

$$I(t) = h_{i0} + h_{i1}P_1 + h_{i2}P_2 + h_{i3}P_3$$

$$Q(t) = h_{q0} + h_{q1}P_1 + h_{q2}P_2 + h_{q3}P_3$$

where, $P_1$ is an output signal of the first channel selection means, $P_2$ is an output signal of the second channel selection means, $P_3$ is an output signal of the third channel selection means, and $h_{ik}$, $h_{qk}$, $k=0, 1, 2, 3$ are circuit parameter constants obtained from circuit elements of the present demodulator.

Further preferably, at least one of the first channel selection means, the second channel selection means, and the third channel selection means includes a low pass filter.

A demodulator according to a second aspect of the present invention comprises a first signal input terminal for receiving as an input a reception signal; a second signal input terminal for receiving as an input a local signal; a first branch circuit having a first terminal, a second terminal, and a third terminal, wherein the first terminal is connected to the first signal input terminal, branching the reception signal input to the first terminal to a signal to the second terminal and a signal to the third terminal, and branching a signal input to the second terminal to a signal to the first terminal and a signal to the third terminal; a second branch circuit having a first terminal, a second terminal, and a third terminal, branching a signal input to the first terminal to a signal to the second terminal and a signal to the third terminal, and branching a signal input to the second terminal to a signal to a first terminal and a signal to the third terminal; a third branch circuit having a first terminal, a second terminal, and a third terminal, wherein the first terminal is connected to the second signal input terminal, branching the local signal input to the first terminal to a signal to the second terminal and a signal to the third terminal, and branching a signal input to the second terminal to a signal to the first terminal and a signal to the third terminal; a first phase shifter having a first terminal and a second terminal, wherein the first terminal is connected to the second terminal of the first branch circuit and the second terminal is connected to the first terminal of the second branch circuit, and shifting the phases of a signal input from the first terminal and a signal input from the second terminal and outputting them from the second terminal and the first terminal; a second phase shifter having a first terminal and a second terminal, wherein the first terminal is connected to the second terminal of the second branch circuit and the second terminal is connected to the second terminal of the third branch circuit, and shifting the phases of a signal input from the first terminal and a signal input from the second terminal and outputting them from the second terminal and the first terminal; a first signal level detection circuit having an input terminal connected to the third terminal of the first branch circuit and detecting a level of a signal output from the third terminal of the first branch circuit; a second signal level detection circuit having an input terminal connected to the third terminal of the second branch circuit and detecting a level of a signal output from the third terminal of the second branch circuit; a third signal level detection circuit having an input terminal connected to the third terminal of the third branch circuit and detecting a level of a signal output from the third terminal of the third branch circuit; a first analog/digital converter for converting an output signal of the first signal level detection circuit from an analog signal to a digital signal; a second analog/digital converter for converting an output signal of the second signal level detection circuit from an analog signal to a digital signal; a third analog/digital converter for converting an output signal of the third signal level detection circuit from an analog signal to a digital signal; and a conversion circuit for converting an output signal of the first analog/digital converter, an output signal of the second analog/digital converter, and an output signal of the third analog/digital converter to a plurality of signal components contained in a reception signal.

Preferably, the demodulator according to the second aspect of the present invention further comprises a first filter for removing a high band component of an output signal of the first signal level detection circuit and inputting it to the first analog/digital converter; a second filter for removing a high band component of an output signal of the second signal level detection circuit and inputting it to the second analog/digital converter; and a third filter for removing a high band component of an output signal of the third signal level detection circuit and inputting it to the third analog/digital converter; and the conversion circuit includes a first channel selection means for selecting a desired channel from an output signal of the first analog/digital converter; a second channel selection means for selecting a desired channel from an output signal of the second analog/digital converter; a third channel selection means for selecting a desired channel from an output signal of the third analog/digital converter; and a computation circuit for demodulating an in-phase component signal I and a quadrature component signal Q based on an output signal of the first channel selection means, an output signal of the second channel selection means, an output signal of the third channel selection means, and a predetermined circuit parameter constant.

Alternatively, preferably, the demodulator further comprises a first channel selection means for selecting a desired channel from an output signal of the first signal level detection circuit and inputting it to the first analog/digital converter; a second channel selection means for selecting a desired channel from an output signal of the second signal level detection circuit and inputting it to the second analog/digital converter; and a third channel selection means for selecting a desired channel from an output signal of the third signal level detection circuit and inputting it to the third analog/digital converter; and the conversion circuit includes a computation circuit for demodulating an in-phase component signal I and a quadrature component signal Q based on an output digital signal of the first analog/digital converter, an output digital signal of the second analog/digital converter, an output digital signal of the third analog/digital converter, and a predetermined circuit parameter constant.

Further, the computation circuit obtains an in-phase component signal I and a quadrature component signal Q by computation based on the following equations:

$$I(t)=h_{i0}+h_{i1}P_1+h_{i2}P_2+h_{i3}P_3$$

$$Q(t)=h_{q0}+h_{q1}P_1+h_{q2}P_2+h_{q3}P_3$$

where $P_1$ is an output signal of the first channel selection means, $P_2$ is an output signal of the second channel selection means, $P_3$ is an output signal of the third channel selection means, and $h_{ik}$, $h_{qk}$, and k=0, 1 2, 3 are circuit parameter constants obtained from circuit elements of the present demodulator.

Further preferably, at least one of the first channel selection means, the second channel selection means, and the third channel selection means includes a low pass filter.

A receiver according to a third aspect of the present invention comprises a demodulator comprising a first signal input terminal for receiving as an input a reception signal, a second signal input terminal for receiving as an input a local signal, a first branch circuit having a first terminal, a second terminal, and a third terminal, wherein the first terminal is connected to the first signal input terminal, branching the reception signal input to the first terminal to a signal to the second terminal and a signal to the third terminal, and branching a signal input to the second terminal to a signal to the first terminal and a signal to the third terminal, a second branch circuit having a first terminal, a second terminal, and a third terminal, branching a signal input to the first terminal to a signal to the second terminal and a signal to the third terminal, and branching a signal input to the second terminal to a signal to a first terminal and a signal to the third terminal, a third branch circuit having a first terminal, a second terminal, and a third terminal, wherein the first terminal is connected to the second signal input terminal, branching the local signal input to the first terminal to a signal to the second terminal and a signal to the third terminal, and branching a signal input to the second terminal to a signal to the first terminal and a signal to the third terminal, a first phase shifter having a first terminal and a second terminal, wherein the first terminal is connected to the second terminal of the first branch circuit and the second terminal is connected to the first terminal of the second branch circuit, shifting phases of a signal input from the first terminal and a signal input from the second terminal and outputting them from the second terminal and the first terminal, a second phase shifter having a first terminal and a second terminal, wherein the first terminal is connected to the second terminal of the second branch circuit and the second terminal is connected to the second terminal of the third branch circuit, and shifting phases of a signal input from the first terminal and a signal input from the second terminal and outputting them from the second terminal and the first terminal, a first signal level detection circuit having an input terminal connected to the third terminal of the first branch circuit and detecting a level of a signal output from the third terminal of the first branch circuit, a second signal level detection circuit having an input terminal connected to the third terminal of the second branch circuit and detecting a level of a signal output from the third terminal of the second branch circuit, a third signal level detection circuit having an input terminal connected to the third terminal of the third branch circuit and detecting a level of a signal output from the third terminal of the third branch circuit, and a conversion circuit for converting an output signal of the first signal level detection circuit, an output signal of the second signal level detection circuit, and an output signal of the third signal level detection circuit to a plurality of signal components contained in a reception signal; a gain control circuit for adjusting a level of a reception signal to a desired level and supplying the signal to the first signal input terminal of the demodulator; and a local signal generation circuit for generating a local signal at a desired oscillation frequency and supplying the signal to the second signal input terminal of the demodulator.

The receiver according to the third aspect of the present invention further comprises an average signal power computation circuit for receiving an output signal of the first signal level detection circuit, an output signal of the second signal level detection circuit, and an output signal of the third signal level detection circuit of the demodulator and computing an average signal power and a gain control signal generation circuit for outputting a control signal to the gain control circuit so that a level of a reception signal input to the demodulator becomes constant based on an average power obtained in the average signal power computation circuit; and the gain control circuit adjusts the input reception signal to a level in accordance with the control signal from the gain control signal generation circuit and supplies it to the first signal input terminal of the demodulator.

Further, the average signal power computation circuit obtains an average signal power by computation based on the following signal.

$$\overline{d^2}=\overline{h_{d0}+h_{d1}P_1+h_{d2}P_2+h_{d3}P_3}$$

where, $d^2$ is a reception signal power and $h_{dk}$ and k=0, 1, 2, 3 are circuit parameter constants obtained from the circuit elements of the demodulator.

Alternatively, preferably, the demodulator further comprises a frequency error detection circuit for detecting a frequency error based on a plurality of signal components obtained by a conversion circuit of a demodulator and supplying the result to the local signal generation circuit, and the local signal generation circuit sets an oscillation frequency of a local signal so as to become an approximately equal frequency to a carrier frequency of a reception signal based on a frequency error value detected in the frequency error detection circuit.

Alternatively, preferably, the conversion circuit of the demodulator comprises a first channel selection means for selecting a desired channel from an output signal from the first signal level detection circuit; a second channel selection means for selecting a desired channel from an output signal from the second signal level detection circuit; a third channel selection means for selecting a desired channel from an output signal from the third signal level detection circuit; and a computation circuit for demodulating an in-phase component signal I and a quadrature component signal Q based on an output signal of the first channel selection means, an output signal of the second channel selection means, an output signal of the third channel selection means, and a predetermined circuit parameter constant.

Further, the computation circuit obtains an in-phase component signal I and a quadrature component signal Q by computation based on the following equations:

$$I(t)=h_{i0}+h_{i1}P_1+h_{i2}P_2+h_{i3}P_3$$

$$Q(t)=h_{q0}+h_{q1}P_1+h_{q2}P_2+h_{q3}P_3$$

where, $P_1$ is an output signal of the first channel selection means, $P_2$ is an output signal of the second channel selection means, $P_3$ is an output signal of the third channel selection means, and $h_{ik}$, $h_{qk}$, and k=0, 1 2, 3 are circuit parameter constants obtained from circuit elements of the demodulator.

Alternatively, preferably, the receiver further comprises a frequency error detection circuit for detecting a frequency error based on an in-phase component signal I and a quadrature component signal Q obtained by a conversion circuit of the demodulator and supplying the result to the local signal generation circuit, and the local signal generation circuit sets an oscillation frequency of a local signal so as to become a substantially equal frequency to a carrier frequency of a reception signal based on a frequency error value detected in the frequency error detection circuit.

Further preferably, at least one of the first channel selection means, the second channel selection means, and the third channel selection means includes a low pass filter.

A receiver according to a fourth aspect of the present invention comprises a demodulator comprising a first signal input terminal for receiving as an input a reception signal, a second signal input terminal for receiving as an input a local signal, a first branch circuit having a first terminal, a second terminal, and a third terminal, wherein the first terminal is connected to the first signal input terminal, branching the reception signal input to the first terminal to a signal to the second terminal and a signal to the third terminal, and branching a signal input to the second terminal to a signal to the first terminal and a signal to the third terminal, a second branch circuit having a first terminal, a second terminal, and a third terminal, wherein a signal input to the first terminal is branched to a signal to the second terminal and a signal to the third terminal, and branching a signal input to the second terminal to a signal to a first terminal and a signal to the third terminal, a third branch circuit having a first terminal, a second terminal, and a third terminal, wherein the first terminal is connected to the second signal input terminal, branching the local signal input to the first terminal to a signal to the second terminal and a signal to the third terminal, and branching a signal input to the second terminal to a signal to the first terminal and a signal to the third terminal, a first phase shifter having a first terminal and a second terminal, wherein the first terminal is connected to the second terminal of the first branch circuit, and the second terminal is connected to the first terminal of the second branch circuit, and shifting the phases of a signal input from the first terminal and a signal input from the second terminal and output them from the second terminal and the first terminal, a second phase shifter having a first terminal and a second terminal, wherein the first terminal is connected to the second terminal of the second branch circuit, and the second terminal is connected to the second terminal of the third branch circuit, and shifting the phases of a signal input from the first terminal and a signal input from the second terminal and outputting them from the second terminal and the first terminal, a first signal level detection circuit having an input terminal connected to the third terminal of the first branch circuit and detecting a level of a signal output from the third terminal of the first branch circuit, a second signal level detection circuit having an input terminal connected to the third terminal of the second branch circuit and detecting a level of a signal output from the third terminal of the second branch circuit, a third signal level detection circuit having an input terminal connected to the third terminal of the third branch circuit and detecting a level of a signal output from the third terminal of the third branch circuit, a first analog/digital converter for converting an output signal of the first signal level detection circuit from an analog signal to a digital signal, a second analog/digital converter for converting an output signal of the second signal level detection circuit from an analog signal to a digital signal, a third analog/digital converter for converting an output signal of the third signal level detection circuit from an analog signal to a digital signal, and a conversion circuit for converting an output signal of the first analog/digital converter, an output signal of the second analog/digital converter, and an output signal of the third analog/digital converter to a plurality of signal components contained in a reception signal; a gain control circuit for adjusting a level of a reception signal to a desired level and supplying it to the first signal input terminal of the demodulator; and a local signal generation circuit for generating a local signal at a desired oscillation frequency and supplying it to the second signal input terminal of the demodulator.

Further, a receiver according to a fourth aspect of the present invention further comprises a first filter for removing a high band component of an output signal of the first signal level detection circuit and inputting it to the first analog/digital converter; a second filter for removing a high band component of an output signal of the second signal level detection circuit and inputting it to the second analog/digital converter; and a third filter for removing a high band component of an output signal of the third signal level detection circuit and inputting it to the third analog/digital converter; and the conversion circuit includes a first channel selection means for selecting a desired channel from an output signal of the first analog/digital converter; a second channel selection means for selecting a desired channel from an output signal of the second analog/digital converter; a third channel selection means for selecting a desired channel from an output signal of the third analog/digital converter; and a computation circuit for demodulating an in-phase component signal I and a quadrature component signal Q based on an output signal of the first channel selection means, an output signal of the second channel selection means, an output signal of the third channel selection means, and a predetermined circuit parameter constant.

Further, in the receiver according to the fourth aspect of the present invention, the demodulator further comprises a first channel selection means for selecting a desired channel from an output signal of the first signal level detection circuit and inputting it to the first analog/digital converter; a second channel selection means for selecting a desired channel from an output signal of the second signal level detection circuit and inputting it to the second analog/digital converter; and a third channel selection means for selecting a desired channel from an output signal of the third signal level detection circuit and inputting it to the third analog/digital converter; and the conversion circuit includes a computation circuit for demodulating an in-phase component signal I and a quadrature component signal Q based on an output digital signal of the first analog/digital converter, an output digital signal of the second analog/digital converter, an output digital signal of the third analog/digital converter, and a predetermined circuit parameter constant.

Further, in the first, second, third, and fourth aspects of the present invention, at least one of the first signal level detection circuit, the second signal level detection circuit, and the third signal level detection circuit comprises a first field effect transistor having a gate to which an input signal is supplied; a second field effect transistor having a source to which a source of the first field effect transistor is connected; a first gate bias supply circuit for supplying a gate bias voltage to the gate of the first field effect transistor;

a second gate bias supply circuit for supplying a gate bias voltage to a gate of the second field effect transistor; a current source connected to a connection point of sources of the first field effect transistor and second field effect transistor; a drain bias supply circuit for supplying a drain bias voltage to drains of the first field effect transistor and second field effect transistor; a first capacitor connected between the drain of the first field effect transistor and a reference potential; and a second capacitor connected between the drain of the second field effect transistor and a reference potential and a voltage difference between a drain voltage of the first field effect transistor and a drain voltage of the second field effect transistor is defined as a detection output.

Preferably, the first field effect transistor and second field effect transistor have substantially the same characteristics; the drain bias supply circuit includes a first drain bias resistance element connected between the drain of the first field effect transistor and a voltage source and a second drain bias resistance element connected between the drain of the field effect transistor and a voltage source; a resistance value of the first drain bias resistance element and a resistance value of the second drain bias resistance element are set to substantially equal values; and a capacitance value of the first capacitor and a capacitance value of the second capacitor are set to substantially equal values.

Alternatively, preferably, a ratio Wga/Wgb of a gate width Wga of the first field effect transistor and a gate width Wgb of the second field effect transistor is set to N; the drain bias supply circuit includes a first drain bias resistance element connected between a drain of the first field effect transistor and a voltage source and a second drain bias resistance element connected between a drain of the second field effect transistor and a voltage source; a resistance value Ra of the first drain bias resistance element and a resistance value Rb of the second drain bias resistance element are set so as to satisfy a condition of Ra/Rb=1/N; and a capacitance value of the first capacitor and a capacitance value of the second capacitor are set to substantially equal values.

According to the present invention, in the demodulator a reception signal is input at the first signal input terminal. The reception signal is supplied to the first terminal of the first branch circuit and branched into two signals. One of the branched signals is supplied from the third terminal to the first power detection circuit. The other branched signal is supplied from the second terminal to the first terminal of the first phase shifter. Then, it is given for example a phase shift θ at the first phase shifter, then is supplied from the second terminal to the first terminal of the second branch circuit. Further, it is branched into two signals at the second branch circuit. One of the branched signals is supplied from the third terminal to the second power detection circuit. The other branched signal is supplied from the second terminal to the first terminal of the second phase shifter. Then, it is given a phase shift θ at the second phase shifter, then is supplied from the second terminal to the second terminal of the third branch circuit. Then, in the third branch circuit, it is branched into a signal to be supplied to the third power detection circuit and a signal supplied to the second signal input terminal.

On the other hand, a local signal is input to the second signal input terminal. The local signal is supplied to the first terminal of the third branch circuit and branched into a signal to be input to the third power detection circuit and a signal to be supplied to the second terminal of the phase shifter. The signal supplied to the second phase shifter is given a phase shift θ, then is supplied from the first terminal to the second terminal of the second branch circuit.

Furthermore, at the second branch circuit, it is branched into a signal to be supplied to the second power detection circuit and a signal to be supplied to the first phase shifter. The signal supplied to the first phase shifter is given a phase shift θ, then is supplied from the first terminal to the second terminal of the first branch circuit. The signal supplied to the first branch circuit is branched into a signal to be supplied to the first power detection circuit and a signal supplied to the first signal input terminal.

Accordingly, the input to the first power detection circuit is supplied with a vector sum signal of a reception signal and a local signal given a phase shift θ1+θ2. Then, an amplitude component is output as a detection signal P1 from the first power detection circuit.

In the same way, the input to the second power detection circuit is supplied with a vector sum signal of the reception signal given a phase shift θ1 and a local signal given a phase shift θ. Then, an amplitude component is output as a detection signal P2 from the second power detection circuit.

Similarly, the input to the third power detection circuit is supplied with a vector sum signal of a reception signal given a phase shift of θ1+θ2 and a local signal. Then, an amplitude component is output as a detection signal P3 from the third power detection circuit.

The baseband signals P1, P2, and P3 output from the first to third power detection circuits are is converted into demodulation signals, that is, an in-phase signal I and quadrature signal Q, in the conversion circuit by performing the calculation based for example on the above equations in the computation circuit.

Further, the output detection signals P1, P2, and P3 of the first to third power detection circuits are supplied to the average signal power computation circuit, where an average signal power of the reception signal is calculated and the result is output to a gain control signal generation circuit.

In the gain control signal generation circuit, based on the average power obtained in the average signal power computation circuit, a control signal is output to the variable gain circuit so that the level of reception signal input to the demodulator becomes constant. Further, in the variable gain circuit, the level of the reception signal is adjusted to a level in accordance with the control signal from the gain control signal generation circuit and supplied to the demodulator.

Further, the in-phase signal I and the quadrature signal Q demodulated in the conversion circuit are output to the frequency error detection circuit. In the frequency error detection circuit receiving the output demodulation signals I and Q, a frequency error is detected from the signals I and Q and the result is supplied to the local signal generation circuit. In the local signal generation circuit, the frequency error value signal detected in the frequency error detection circuit is received and a local signal having an approximately same oscillation frequency as a reception signal frequency is generated and supplied to the demodulator.

BRIEF DESCRIPTION OF THE DRAWINGS

FIGS. 2A and 2B are block diagrams of a first example of the configuration of a six-port demodulator.

FIGS. 3A and 3B are block diagrams of a second example of the configuration of a six-port demodulator.

FIG. 4 is a block diagram of a third example of the configuration of a six-port demodulator.

BEST MODE FOR CARRYING OUT THE INVENTION

Below, embodiments of the present invention will be explained with reference to the attached drawings.

Figure 1:
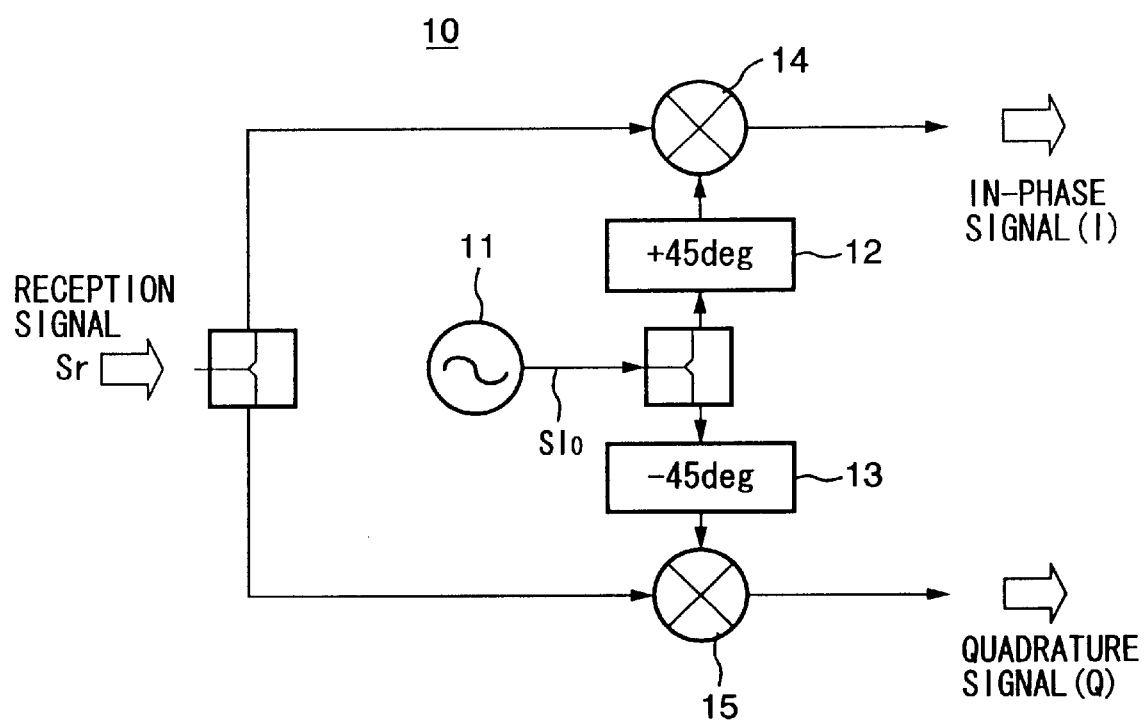
FIG. 1 is a circuit diagram of the configuration of a key portion of a general demodulator.
Figure 5:
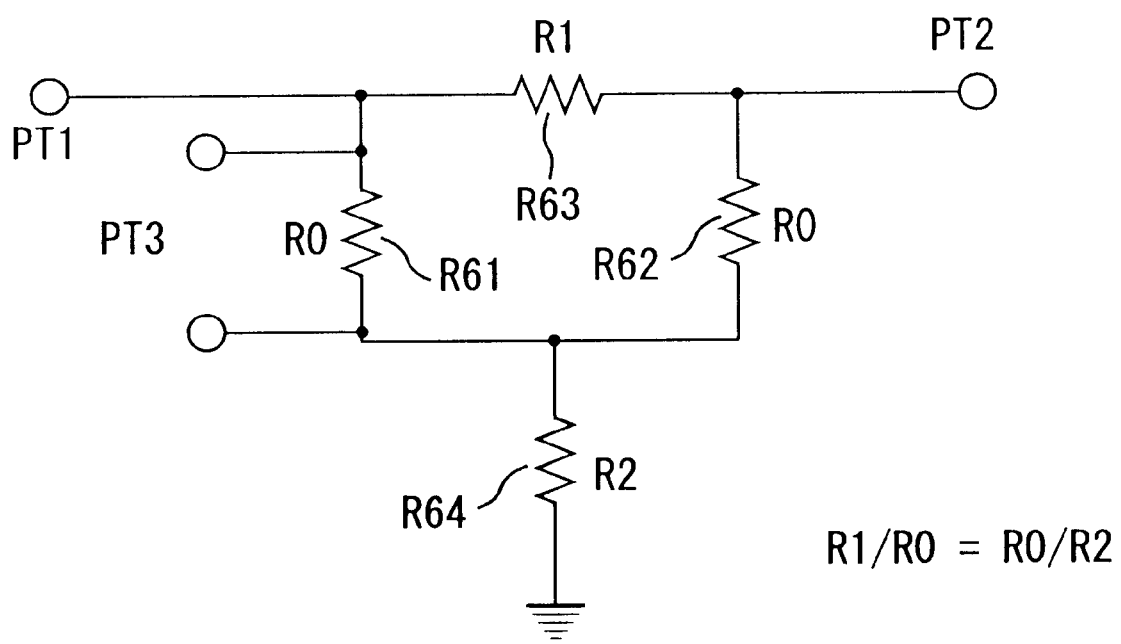
FIG. 5 is a circuit diagram of a directional coupler using a Wheatstone bridge.
Figure 6:
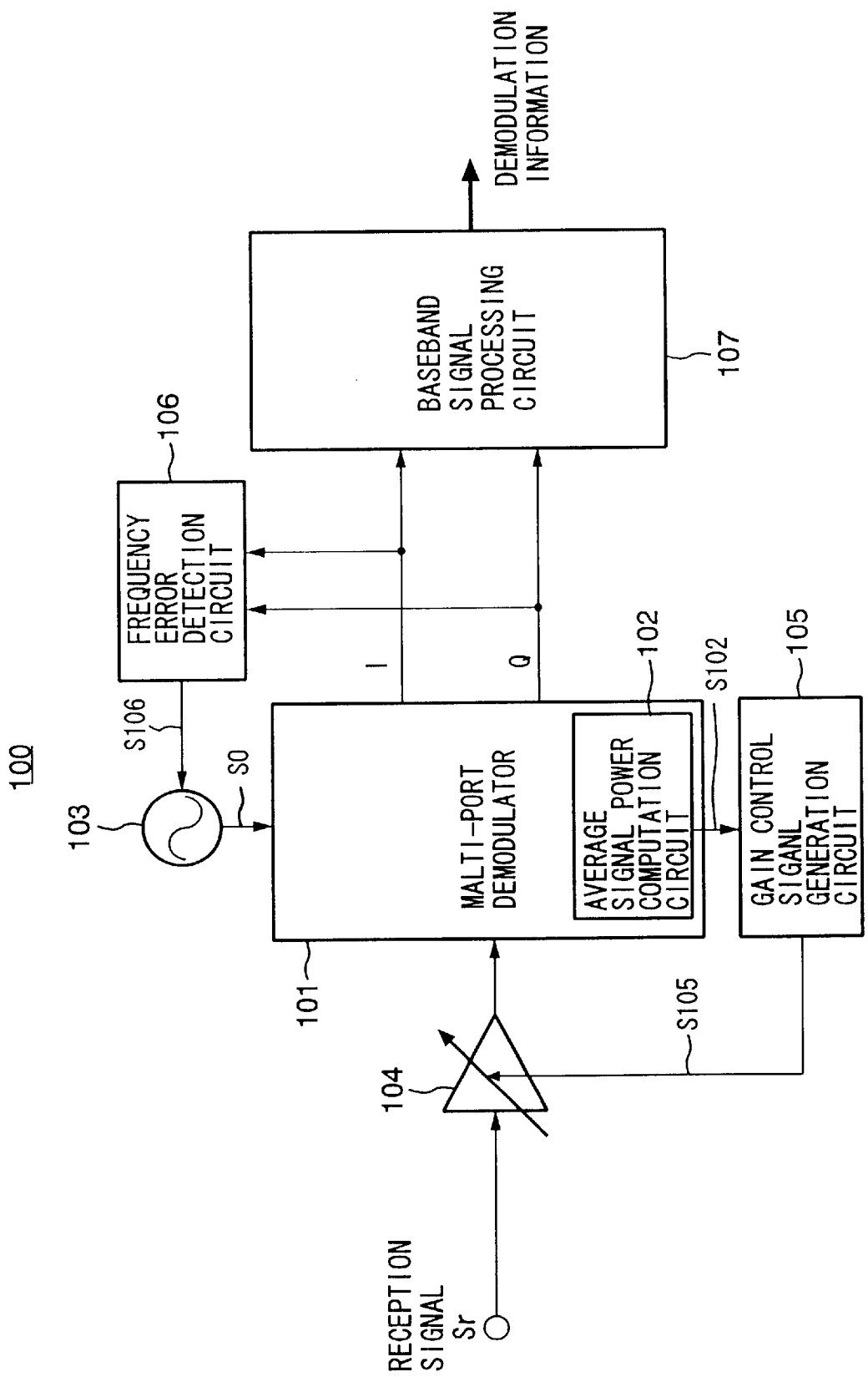
FIG. 6 is a block diagram of an embodiment of a receiver using a direct conversion type demodulator according to the present invention.

FIG. 6 is a block diagram of an embodiment of a receiver using a direct conversion type demodulator according to the present invention.

A receiver 100 according to the present embodiment comprises as main components, as shown in FIG. 6, a multi-port demodulator 101, an average signal power computation circuit 102, a local signal generation circuit 103, a variable gain circuit 104, a gain control signal generation circuit 105, a frequency error detection circuit 106, and a baseband signal processing circuit 107.

The multi-port demodulator 101 is comprised of a five-port demodulator, receives a reception signal Sr adjusted in level at the variable gain circuit 104 and a local signal SO generated at the local signal generation circuit 103, generates three signals having phase differences, detects signal levels (amplitude components) of these signals, converts to an in-phase signal (I) and a quadrature signal (Q) included in the reception signal based on the three power detection signals P1, P2, and P3, and supplies the in-phase signal (I) and the quadrature signal (Q) to the frequency error detection circuit 106 and the baseband signal processing circuit 107.

Further, the multi-port demodulator 101 supplies the power detection signals (baseband signals) P1, P2, and P3 to the average power computation circuit 102 integrated on one chip.

Figure 7:
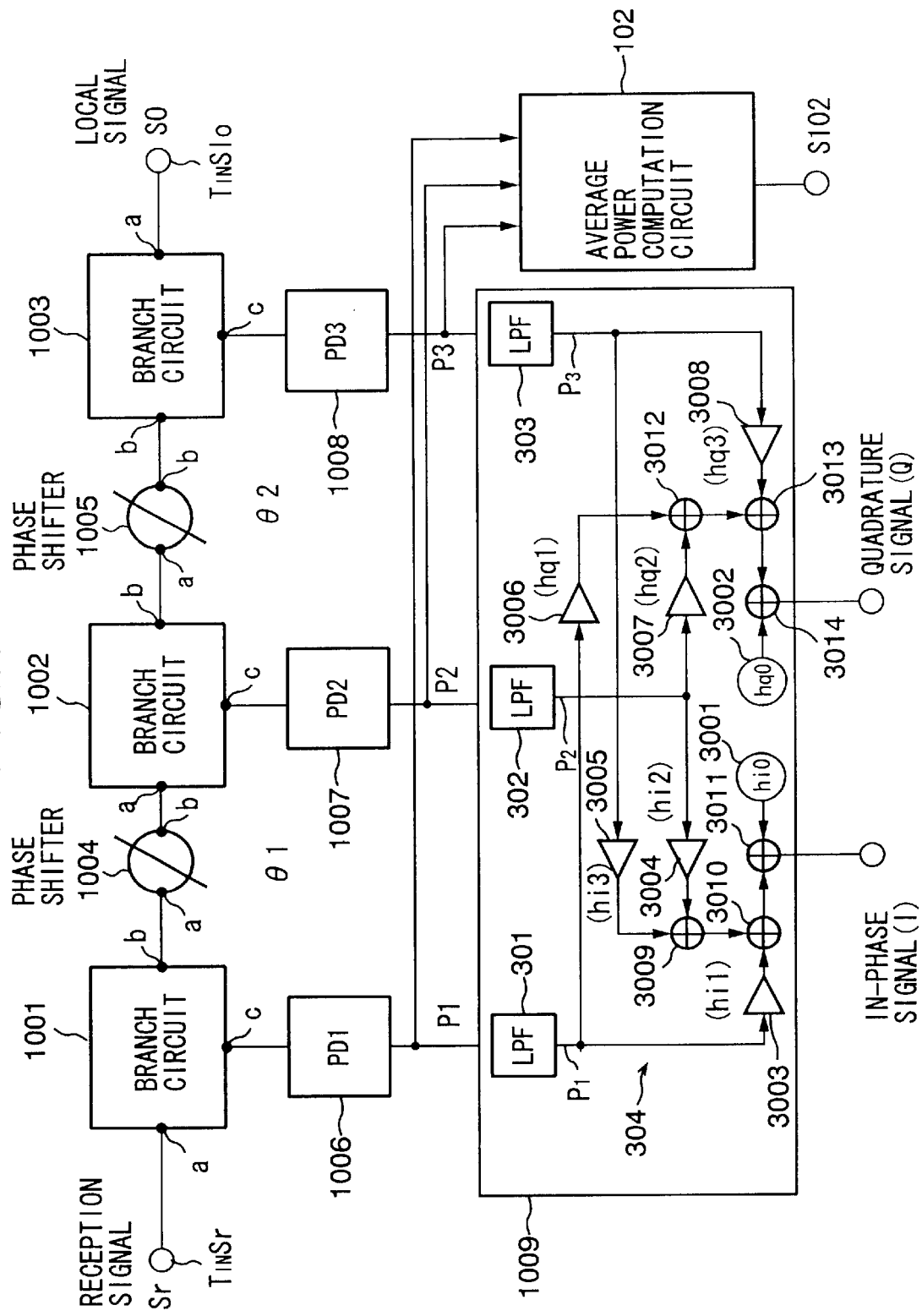
FIG. 7 is a block diagram of a specific example of the configuration of a multi-port demodulator according to the present invention.

FIG. 7 is a block diagram of a specific example of the configuration of the multi-port demodulator 101.

The multi-port demodulator 101 comprises, as shown in FIG. 7, a first signal input terminal TINSr for a reception signal, a second signal input terminal TINSlo for a local signal, a first branch circuit 1001, a second branch circuit 1002, a third branch circuit 1003, a first phase shifter 1004, a second phase shifter 1005, a first power detection circuit 1006, a second power detection circuit 1007, a third power detection circuit 1008, and an N-port signal-IQ signal conversion circuit 1009.

The first branch circuit 1001 comprises a first terminal a, a second terminal b, and a third terminal c. The first terminal a is connected to the first signal input terminal TINSr, a reception signal Sr input to the first terminal a is branched to a signal to the second terminal b and a signal to the third terminal c, and a signal input to the second terminal b is branched to a signal to the first terminal a and a signal to the third terminal c. Further, the third terminal c of the first branch circuit 1001 is connected to an input terminal of the first power detection circuit 1006.

The second branch circuit 1002 comprises a first terminal a, a second terminal b, and a third terminal c, branches a signal input to the first terminal a to a signal to the second terminal b and a signal to the third terminal c, and branches a signal input to the second terminal b to a signal to the first terminal a and a signal to the third terminal c. Further, the third terminal c of the second branch circuit 1002 is connected to an input terminal of the second power detection circuit 1007.

The third branch circuit 1003 comprises a first terminal a, a second terminal b, and a third terminal c. The first terminal a is connected to a second signal input terminal TINSlo, a local signal SO input to the first terminal a is branched to a signal to the second terminal b and a signal to the third terminal c, and a signal input to the second terminal b is branched to a signal to the first terminal a and a signal to the third terminal c. The third terminal c of the third branch circuit 1003 is connected to an input terminal of the third power detection circuit 1008.

The first phase shifter 1004 comprises a first terminal a and a second terminal b. The first terminal a is connected to the second terminal b of the first branch circuit 1001, the second terminal b is connected to the first terminal a of the second branch circuit, and a signal input from the first terminal a and a signal input from the second terminal b are shifted in phase and output from the second terminal b and the first terminal a.

The second phase shifter 1005 comprises a first terminal a and a second terminal b. The first terminal a is connected to the second terminal b of the second branch circuit 1002, the second terminal b is connected to the second terminal b of the third branch circuit 1003, and a signal input from the first terminal a and a signal input from the second terminal b are shifted in phase and output from the second terminal b and the first terminal a.

Here, the five ports are the two ports of the reception signal input terminal TINSr and the local signal input terminal TINSlo plus the three ports of an output terminal (third terminal c) of the first branch circuit 1001 to the power detection circuit 1006, an output terminal (third terminal c) of the second branch circuit 1002 to the second power detection circuit 1007, and an output terminal (third terminal c) of the third branch circuit 1003 to the third power detection circuit 1008.

Figure 8:
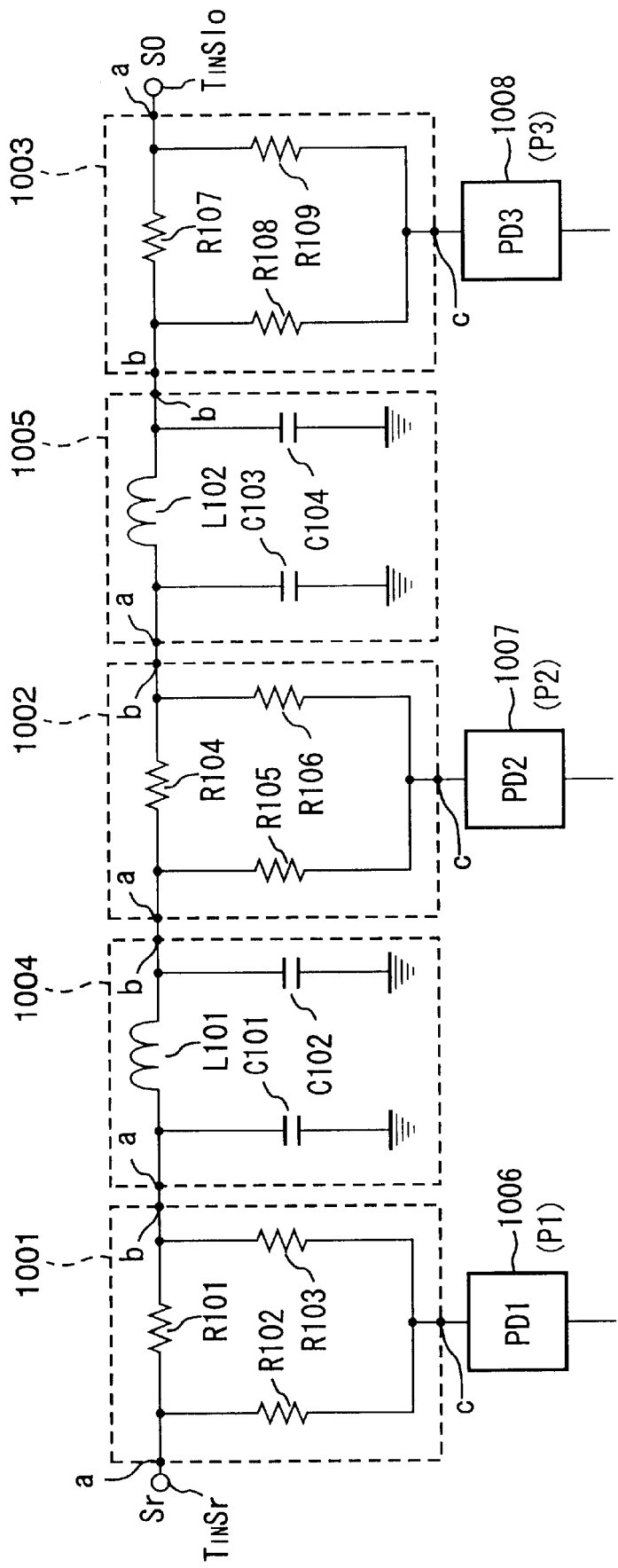
FIG. 8 is a circuit diagram of a specific example of the configuration of a branch circuit and a phase shifter in FIG. 7.

FIG. 8 is a circuit diagram of a specific example of the configuration of the first, second, and third branch circuits 1001, 1002, and 1003 and the first and second phase shifters 1004 and 1005.

As shown in FIG. 8, the first branch circuit 1001 is comprised of a resistance branch circuit having resistance elements R101 to R103. In the first branch circuit 1001, the resistance element R101 is connected between the first terminal a and the second terminal b, the resistance element R102 is connected between the first terminal a and the third terminal c, and the resistance element R013 is connected between the second terminal b and the third terminal c.

The second branch circuit 1002 is comprised of a resistance branch circuit having resistance elements R104 to R106. In the second branch circuit 1002, the resistance element R104 is connected between the first terminal a and the second terminal b, the resistance element R105 is connected between the first terminal a and the third terminal c, and the third resistance element R106 is connected between the second terminal b and the third terminal c.

The third branch terminal 1003 is comprised of a resistance branch circuit having resistance elements R107 to R109. In the third branch circuit 1003, the resistance element R107 is connected between the first terminal and the second terminal b, the resistance element R109 is connected between the first terminal a and the third terminal c, and the third resistance element R108 is connected between the second terminal b and the third terminal c.

Further, the first phase shifter 1004 is configured by a n-shaped LC phase shifter comprising an inductor L101 and capacitors C101 and C102. In the first phase shifter 1004, the inductor L101 is connected between the first terminal a and the second terminal b, the capacitor C101 is connected between the first terminal a and the ground potential GND, and the capacitor C102 is connected between the second terminal b and the ground potential GND.

The second phase shifter 1005 is configured by a n-shaped LC phase shifter comprising an inductor L102 and capacitors C103 and C104. In the second phase shifter 1005, the inductor L102 is connected between the first terminal a and the second terminal b, the capacitor C103 is connected between the first terminal a and the ground potential GND, and the capacitor C104 is connected between the second terminal b and the ground potential GND.

In the above configuration, a reception signal Sr(t) is input to the first signal input terminal TINSr. Note that Sr(t) is a voltage of the input terminal TINSr at a time t. The reception signal Sr(t) is supplied to the first terminal a of the first branch circuit 1001 and branched to two signals. One of the branched signals is supplied from the third terminal c to the first power detection circuit 1006. The other branched signal is supplied from the second terminal b to the first terminal a of the first phase shifter 1004. Then, after given a phase shift θ in the first phase shifter 1004, it is supplied from the second terminal b to the first terminal a of the second branch circuit 1002. Furthermore, in the second branch circuit 1002, it is branched to two signals. One of the branched signals is supplied from the third terminal c to the second power detection circuit 1007. The other branched signal is supplied from the second terminal b to the first terminal a of the second phase shifter 1005. Then, after given a phase shift θ in the second phase shifter 1005, it is supplied from the second terminal b to the second terminal b of the third branch circuit 1003. Furthermore, it is branched to a signal to be supplied to the third power detection circuit 1008 and a signal to be supplied to the second signal input terminal TINSlo in the third branch circuit 1003.

On the other hand, a local signal SO(t) is input to the second signal input terminal TINSlo. SO(t) is a voltage of the input terminal TINSlo at a time t. The local SO(t) is supplied to the first terminal a of the third branch circuit 1003 and branched to a signal to be input to the third power detection circuit 1008 and a signal to be supplied to the second terminal b of the phase shifter 1005. The signal supplied to the second phase shifter 1005 is given a phase shift θ, then supplied from the first terminal a to the second terminal b of the second branch circuit 1002. Furthermore, it is branched to a signal to be supplied to the second power detection circuit 1007 and a signal to be supplied to the first phase shifter 1004 in the second branch circuit 1002. The signal supplied to the first phase shifter 1004 is given a phase shift θ, then supplied from the first terminal a to the second terminal b of the first branch circuit 1001. The signal supplied to the first branch circuit 1001 is branched to a signal to be supplied to the first power detection circuit 1006 and a signal to be supplied to the first signal input terminal TINSlo.

Accordingly, the input of the first power detection circuit 1006 is supplied with a vector sum signal of the reception signal Sr(t) and the local signal SO(t) given a phase shift θ1+θ2. The first power detection circuit 1006 outputs its amplitude component as a detection signal P1.

In the same way, the input of the second power detection circuit 1007 is supplied with a vector sum signal of the reception signal Sr(t) given a phase shift θ1 and the local signal SO(t) given a phase shift θ. The second power detection circuit 1007 outputs its amplitude component as a detection signal P2.

Similarly, the input of the third power detection circuit 1008 is supplied with a vector sum signal of the reception signal Sr(t) given a phase shift of θ1+θ2 and the local signal SO(t). The third power detection circuit 1008 outputs its amplitude component as a detection signal P3.

Here, a specific configuration of a power detection circuit able to be applied to a multi-port demodulator will be explained.

Figure 9:
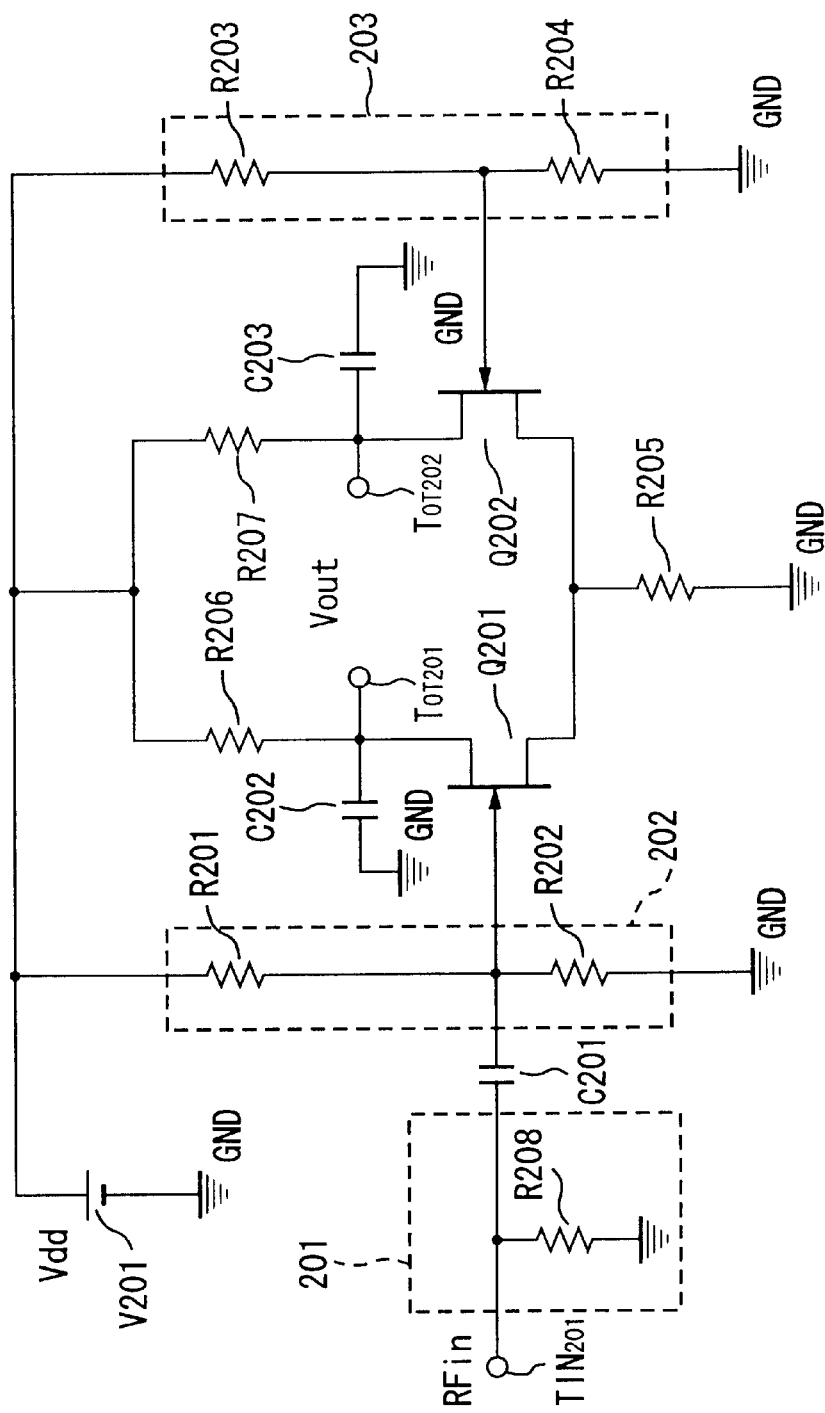
FIG. 9 is a circuit diagram of an example of a power detection circuit according to the present invention.

FIG. 9 is a circuit diagram of an example of a power detection circuit according to the present invention.

The power detection circuit 200 (PD1, PD2, and PD3) comprises two first and second field effect transistors (hereinafter referred to as transistors) Q201 and Q202 as active elements, capacitors C201, C202, and C203, resistance elements R201, R202, R203, R204, R205, R206, R207, and R208, a voltage source V201, a matching circuit (MTR) 201, and gate bias supply circuits 202 and 203.

The matching circuit 201 is comprised of the resistance element R208. The resistance element R201 is connected between a connection point of an input terminal TIN201 and one electrode of a direct-current (DC) cutoff capacitor C201 and the ground potential GND.

The gate bias supply circuit 202 is comprised of the resistance elements R201 and R202 connected in series between the voltage source V201 and the ground potential GND. A connection point of the resistance elements R201 and R202 is connected to the other electrode of the capacitor C201 and a gate of the transistor Q201.

The gate bias supply circuit 202 having the above configuration generates a bias voltage of the transistor Q201 by dividing a voltage Vdd of the voltage source V201 by the resistance elements R201 and R202.

The gate bias supply circuit 203 is comprised of the resistance elements R203 and R204 connected in series between the voltage source V201 and the ground potential GND. A connection point of the resistance elements R203 and R204 is connected to a gate of the transistor Q202.

The gate bias supply circuit 203 having the above configuration generates a bias voltage of the transistor Q202 by dividing the voltage Vdd of the voltage source V201 by the resistance elements R203 and R204.

Note that the gate bias supply circuit can be configured not by resistance division, but for example by a choke coil (inductor having a sufficiently large inductance value), a choke coil- and shunt-connected capacitance, a distributed constant line, etc.

A source of the transistor Q201 and a source of the transistor Q202 are connected and a connection point thereof is connected to the ground potential GND via the resistance element R205 serving as a current source.

A drain of the transistor Q201 is connected to one end of the resistance element R206, one electrode of the capacitor C202, and a first output terminal TOT201. The other end of the resistance element R206 is connected to the voltage source V201 having a voltage Vdd, while the other electrode of the capacitor C202 is connected to the ground potential GND.

A drain of the transistor Q202 is connected to one end of the resistance element R207, one electrode of the capacitor C203, and a second output terminal TOT202. The other end of the resistance element R207 is connected to the voltage source V201 having a voltage Vdd, while the other electrode of the capacitor C203 is connected to the ground potential GND.

A drain bias voltage is supplied to the drain of the transistor Q201 via the resistance element R206, and a drain bias voltage is supplied to the drain of the transistor Q202 via the resistance element R207.

In the power detection circuit 200 configured to have the above connection relationships, the transistors Q201 and Q202 serving as the active elements, for example, have the same device structures so as to have substantially the same characteristics.

Further, in a circuit according to the present embodiment, resistance values Rga1 and Rgb1 of the resistance elements R201 and R202 and resistance values Rga2 and Rgb2 of the resistance elements R203 and R204 composing the gate bias supply circuits 202 and 203 need to satisfy conditions of Rga1=Rga2 and Rgb1=Rgb2, and the gate bias voltages of the transistors Q201 and Q202 need to be made equal as much as possible.

Further, a resistance value Rda of the resistance element R206 and a resistance value Rdb of the resistance element R207 connected to the drains of the transistors Q201 and Q202 satisfy a condition of Rda=Rdb.

In the same way, it is preferable that a capacitance value Couta of the capacitor C202 and a capacitance value Coutb of the capacitor C203 satisfy a condition of Couta=Coutb. The capacitances Couta and Coutb are set to be sufficiently large capacitance values so that their impedances become almost 0 ohm at higher frequencies including an input high frequency signal of an input frequency fin.

Alternatively, the power detection circuit 200 is configured so as to satisfy conditions of Rda/Rdb=1/N and Couta=Coutb when assuming a ratio of a gate width Wga of the transistor Q201 and a gate width Wgb of the transistor Q202 (Wga/Wgb) is N.

Specifically, by setting the gate width Wgb of the transistor Q202 smaller than the gate width Wga of the transistor Q201 and by setting the resistance value Rdb of the drain bias resistance element R207 larger than the resistance value Rda of the resistance element R206, the current consumption can be improved.

For example, by the ratio Wga/Wgb of the gate width Wga of the transistor Q201 and the gate width Wgb of the transistor Q202 being set to N and further the resistance value Rdb of the resistance element R207 being set to N times the resistance value Rda of the resistance element R206, the current consumption can be reduced to (N+1)/(2N) compared with the case of using transistors having the same characteristics of the transistors Q201 and Q202.

Next, the operation of a power detection circuit having the above configuration will be explained.

A high frequency signal RFin input to the input terminal TIN201 is supplied to the gate of the transistor Q201 via the matching circuit 201 and the DC cutoff capacitor C201.

At this time, the gate of the transistor Q201 is supplied with a gate bias voltage generated by the gate bias supply circuit 202. In the same way, the gate of the transistor Q202 is supplied with a gate bias voltage generated by the gate bias supply circuit 203.

Further, drains of the transistors Q201 and Q202 are supplied with a drain bias voltage via the resistance elements R206 and R207, respectively.

Further, coupling capacitors C202 and C203 having sufficiently large capacitance values are connected between the drains of the transistors Q201 and Q202 and the ground potential GND, so the drains of the transistors Q201 and Q202 become stable in state in terms of high frequency.

As a result, a difference between the drain voltage of the transistor Q201, that is, the voltage of the first output terminal TOT201, and the drain voltage of the transistor Q202, that is, the voltage of the second output terminal TOT202, is supplied as a detection output signal Vout to a not shown later processing circuit.

Below, detection characteristics of the power detection circuit in FIG. 9 will be considered with reference to FIG. 10 and FIG. 11.

Figure 10:
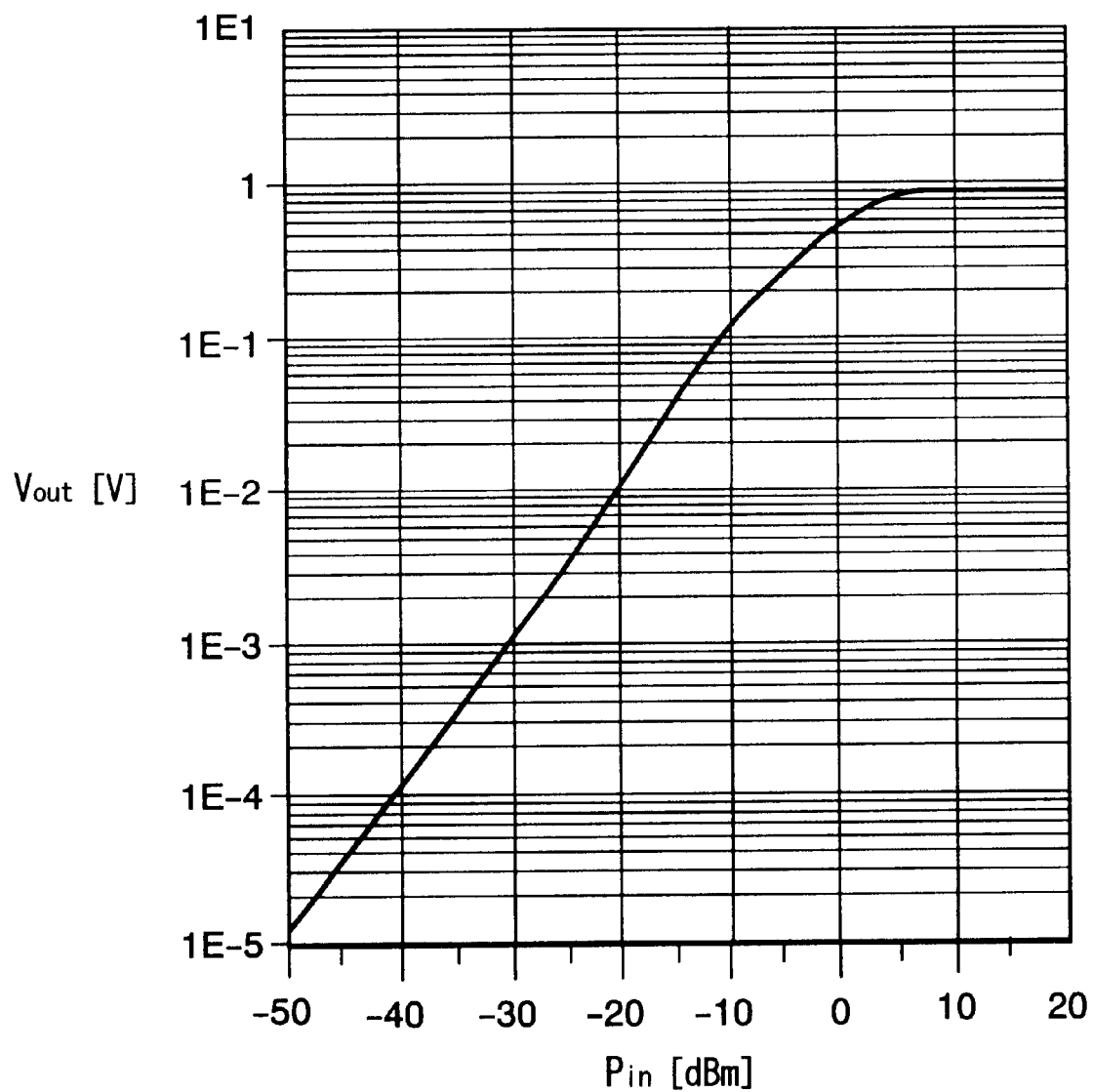
FIG. 10 is a view of an example of detection characteristics of the power detection circuit in FIG. 9.

FIG. 10 is a view of an example of the detection characteristics of the power detection circuit in FIG. 9.

In FIG. 10, the abscissa indicates an input high frequency power Pin and the ordinate indicates an output detection voltage Vout. A frequency of the input high frequency signal is 5.5 GHz.

As is understood from FIG. 10, the power detection circuit in FIG. 9 has an excellent linearity.

Figure 11:
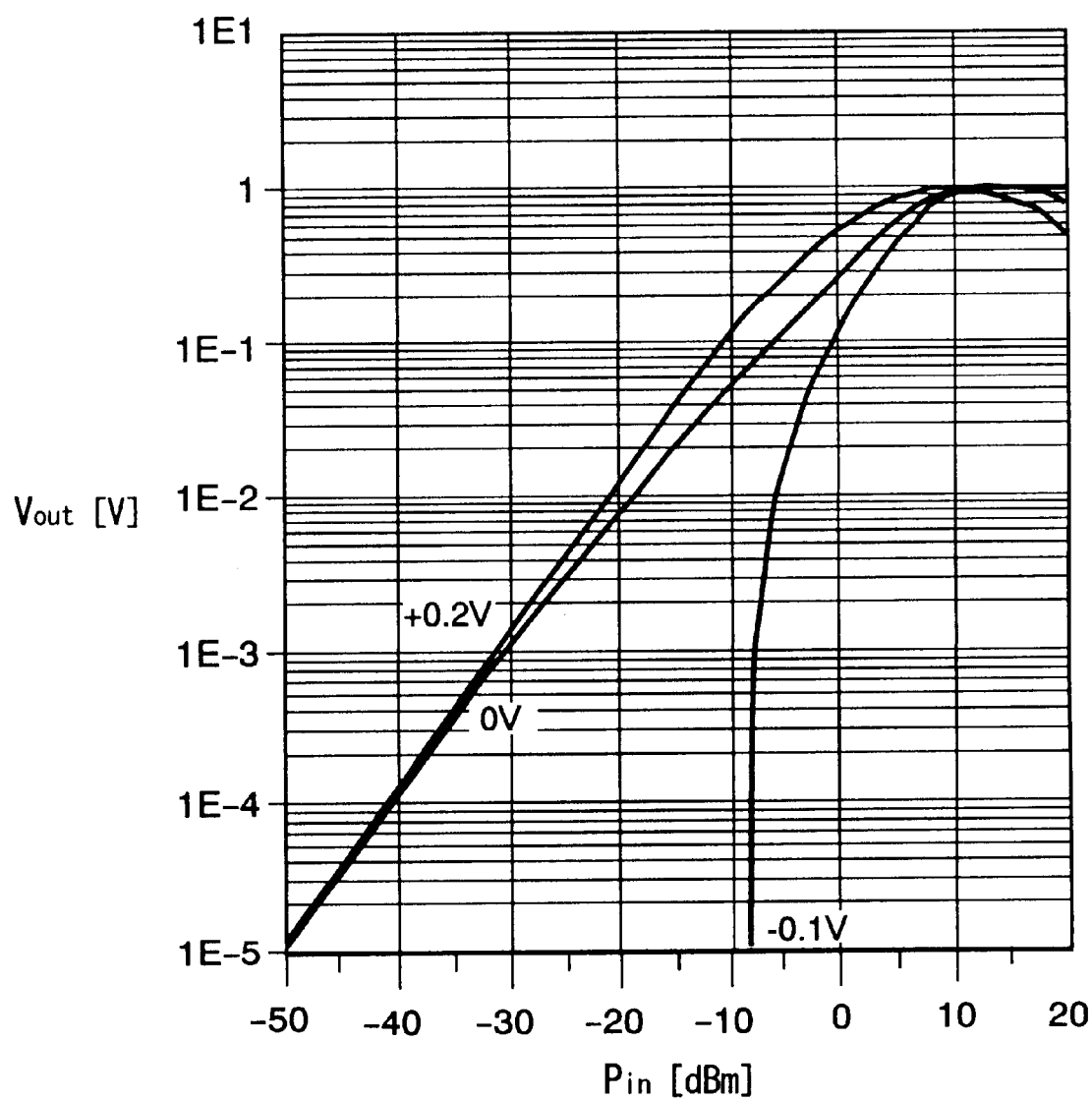
FIG. 11 is a view of the characteristic of a high frequency input power Pin versus output detection voltage Vout when using a gate bias voltage as a parameter in the circuit in FIG. 9.

FIG. 11 is a view of detection characteristics of the power detection circuit in FIG. 9 when a gate bias voltage is used as a parameter.

In FIG. 11 as well, the abscissa indicates an input high frequency power Pin and the ordinate indicates an output detection voltage Vout.

From FIG. 11, it is understood that the power detection circuit in FIG. 9 has a smaller fluctuation in the Pin to Vout characteristics than fluctuation in gate bias.

Namely, a DC offset is not generated in the power detection circuit of FIG. 9.

The N-port signal-IQ signal conversion circuit 1009 receives output signals P1, P2, and P3 of three power detection circuits 1006 to 1008, performs the calculation based on the following equations (1) and (2) by the computation circuit, converts the signals to demodulation signals, that is, an in-phase signal I(t) and a quadrature signal Q(t), and outputs them to the frequency error detection circuit 106 and the baseband signal processing circuit 107.

$$I(t)=h_{i0}+h_{i1}P_1+h_{i2}P_2+h_{i3}P_3 \quad (1)$$

$$Q(t)=h_{q0}+h_{q1}P_1+h_{q2}P_2+h_{q3}P_3 \quad (2)$$

where, $h_{i0}$, $h_{i1}$, $h_{i2}$, $h_{i3}$, $h_{q0}$, $h_{q1}$, $h_{q2}$, and $h_{q3}$ are found from circuit constants of the branch circuits 1001 to 1003, the phase shifters 1004 and 1005, and the power detection circuits 1006 to 1008 composing the multi-port demodulator.

The N-port signal-IQ signal conversion circuit 1009 specifically comprises, as shown in FIG. 7, channel selection low pass filters (LPF) 301, 302, and 303 and a computation circuit 304.

The computation circuit 304 comprises, as shown in FIG. 7, a coefficient $h_{i0}$ generator 3001, a coefficient $h_{q0}$ generator 3002, a coefficient $h_{i1}$ multiplier 3003, a coefficient $h_{i2}$ multiplier 3004, a coefficient $h_{i3}$ multiplier 3005, a coefficient $h_{q1}$ multiplier 3006, a coefficient $h_{q2}$ multiplier 3007, a coefficient $h_{q3}$ multiplier 3008, and adders 3009 to 3014.

In the computation circuit 304, the output signal P1 of the power detection circuit 1006 whose channel is selected in the LPF 301 is multiplied with the coefficient $h_{i1}$ in the multiplier 3003, and the result of the multiplication $h_{i1}P_1$ is supplied to the adder 3010. Further, the output signal P1 of the power detection circuit 1006 whose channel is selected by the LPF 301 is multiplied with the coefficient $h_{q1}$ in the multiplier 3006, and the result of the multiplication $h_{q1}P_1$ is supplied to the adder 3012.

The output signal P2 of the power detection circuit 1007 whose channel is selected in the LPF 302 is multiplied with the coefficient $h_{i2}$ in the multiplier 3004, and the result of the multiplication $h_{i2}P_2$ is supplied to the adder 3009. Further, the output signal P2 of the power detection circuit 1006 whose channel is selected by the LPF 302 is multiplied with the coefficient $h_{q2}$ in the multiplier 3007, and the result of the multiplication $h_{q2}P_2$ is supplied to the adder 3012.

Further, the output signal P3 of the power detection circuit 1008 whose channel is selected in the LPF 303 is multiplied with the coefficient $h_{i3}$ in the multiplier 3005, and the result of the multiplication $h_{i3}P_3$ is supplied to the adder 3009. Further, the output signal P3 of the power detection circuit 1008 whose channel is selected by the LPF 303 is multiplied with the coefficient $h_{q3}$ in the multiplier 3008, and the result of the multiplication $h_{q3}P_3$ is supplied to the adder 3013.

In the adder 3009, the output $h_{i2}P_2$ of the multiplier 3004 and the output $h_{i3}P_3$ of the multiplier 3005 are added and the result $(h_{i2}P_2+h_{i3}P_3)$ is supplied to the adder 3010. In the adder 3010, the output $h_{i1}P_1$ of the adder 3003 and the output $(h_{i2}P_2+h_{i3}P_3)$ of the adder 3009 are added and the result $(h_{i1}P_1+h_{i2}P_2+h_{i3}P_3)$ is supplied to the adder 3011. Then, in the adder 3011, the coefficient $h_{i0}$ from the coefficient $h_{i0}$ generator 3001 and the output $(h_{i1}P_1+h_{i2}P_2+h_{i3}P_3)$ of the adder 3010 are added to obtain an in-phase signal $I(t)=h_{i0}+h_{i1}P_1+h_{i2}P_2+h_{i3}P_3$ indicated in the above equation (1).

On the other hand, in the adder 3012, the output $h_{q2}P_1$ of the multiplier 3006 and the output $h_{q3}P_2$ of the multiplier 3007 are added and the result $(h_{q1}P_1+h_{q2}P_2)$ is supplied to the adder 3013. In the adder 3013, the output $h_{q3}P_3$ of the multiplier 3008 and the output $(h_{q1}P_1+h_{q2}P_2)$ of the adder 3012 are added and the result $(h_{q1}P_1+h_{q2}P_2+h_{q3}P_3)$ is supplied to the adder 3014. Then, in the adder 3014, the coefficient $h_{q0}$ from the coefficient $h_{q0}$ generator 3002 and the output $(h_{q1}P_1+h_{q2}P_2+h_{q3}P_3)$ of the adder 3013 are added to obtain the quadrature signal $Q(t)=h_{q0}+h_{q1}P_1+h_{q2}P_2+h_{q3}P_3$ indicated in the above equation (2).

The average power computation circuit 102 receives the output signals P1, P2, and P3 of the three power detection circuits 1006 to 1008, obtains an average power of the reception signals based on the equation (3) below, and outputs the same as a signal S102 to the gain control signal generation circuit 105:

$$\overline{d^2}=h_{d0}+h_{d1}P_1+h_{d2}P_2+h_{d3}P_3 \quad (3)$$

Here, $d^2$ is a reception signal power, and $h_{d0}$, $h_{d1}$, $h_{d2}$, and $h_{d3}$ are found from circuit constants of the branch circuits 1001 to 1003, the phase shifters 1004 and 1005, and the power detection circuits 1006 to 1008 composing the multi-port demodulator.

A local signal generation circuit 103 receives a frequency error value detected in the frequency error detection circuit 106 as a signal S106, generates a local signal SO having an approximately equal oscillation frequency to the reception signal frequency, and supplies the same to the multi-port demodulator 101.

A variable gain circuit 104 adjusts a level of a reception signal received by a not shown antenna element and passed through a pre-select RF filter and a low noise amplifier to a level in accordance with a control signal S105 from the gain control signal generation circuit 105 and supplies the result to the multi-port demodulator 101.

The gain control signal generation circuit 105 outputs the control signal S105 to the variable gain circuit 104 so that the reception signal level input to the multi-port demodulator 101 becomes constant based on the average power signal S102 found in the average signal power computation circuit 102.

The frequency error detection circuit 106 detects a frequency error from the output signals I and Q of the multi-port demodulator 101 and supplies the same as a signal S106 to the local signal generation circuit 103.

The baseband signal processing circuit 107 performs a predetermined baseband signal processing based on the output signals I and Q of the multi-port demodulator 101 to obtain demodulation information and outputs the same to a not shown processing circuit in the next stage.

Next, the operation by the above configuration will be explained in detail.

Note that, here, for simplification of the explanation, a case will be explained where the multi-port demodulator 101 has a symmetric configuration with respect to two input terminals as shown in FIG. 2.

A reception signal Sr(t) adjusted to a predetermined level in the variable gain circuit 104 is input to the input terminal TINSr. As explained above, Sr(t) is a voltage of an input terminal TINSr at a time t and expressed as the equation (4) below. Note that here, the reception signal Sr(t) is made a modulation signal given information in its phase and amplitude. Since frequency is a ratio of change of phase and frequency modulation is a modulation method giving information to the phase, Sr(t) may be a frequency modulation signal.

$$Sr(t)=Ade^{j(\omega_c t+\phi)}=A(d\cos\phi+jd\sin\phi)e^{j\omega_c t}=A(I(t)+jQ(t))e^{j\omega_c t} \quad (4)$$

where, A is an average voltage amplitude, d is an amplitude modulation component, $\phi$ is a phase modulation component, and $\omega c$ is a carrier angular frequency, and $I(t)=d\cos\phi$ and $Q(t)=d\sin\phi$.

Further, a local signal S0(t) generated by the local signal generation circuit 103 is input to an input terminal TINSlo. As explained above, S0(t) is a voltage of the input terminal TINSlo at a time t and is expressed by the equation (5) below:

$$SO(t) = A_0 e^{j\omega_c t} \tag{5}$$

Further, as explained above, since the variable gain circuit 104 operates in accordance with the control signal S105 so that the level of the reception signal input to the multi-port demodulator 101 becomes constant, the ratio A/A0 becomes constant. Here, a case of A=A0 will be explained for simplification.

Input voltages v1, v2, and v3 of the first power detection circuit 1006, the second power detection circuit 1007, and the third power detection circuit 1008 of signals output from the first branch circuit 1001, the second branch circuit 1002, and the third branch circuit 1003 are expressed by the next equations:

$$v_1(t) = k_{11} S_r(t) + k_{12} SO(t) e^{-j(\theta_1 + \theta_2)} \tag{6}$$

$$v_2(t) = k_{21} S_r(t) e^{-j\theta_1} + k_{22} SO(t) e^{-j\theta_2} \tag{7}$$

$$v_3(t) = k_{31} S_r(t) e^{-j(\theta_1 + \theta_2)} + k_{32} SO(t) \tag{8}$$

Here, kij indicates a voltage transmission coefficient (scalar amount) when using a terminal j as an input and i as an output. j=1 corresponds to the input terminal TINSr and j=2 corresponds to the input terminal TINSlo. i=1, 2, and 3 correspond to input terminals of the power detection circuits 1006, 1007, and 1008.

A baseband output signal voltage of the power detection circuits can be expressed by the equation below:

$$Pi = Ci|vi|^2 \tag{9}$$

where, Ci indicates a coefficient of a power detection circuit.

Accordingly, baseband output signal voltages of the power detection circuits 1006, 1007, and 1008 can be expressed by the equations below:

$$P_1 = C_1 |k_{11} S_r(t) + k_{12} S0(t) e^{-j(\theta_1 + \theta_2)}|^2 \tag{10}$$

$$P_2 = C_2 |k_{21} S_r(t) e^{-j\theta_1} + k_{22} S0(t) e^{-j\theta_2}|^2 \tag{11}$$

$$P_3 = C_3 |k_{31} S_r(t) e^{-j(\theta_1 + \theta_2)} + k_{32} S0(t)|^2 \tag{12}$$

As assumed to have a symmetric structure with respect to two inputs, k11=k32, k21=k22, k31=k12, and θ=θ1=θ2. As already explained above, it is assumed that A=A0. Since the three power detection circuits have equivalent configurations, is possible to express as C=C1=C2=C3.

Due to the above, the above equations (10), (11), and (12) can be modified as below:

$$\frac{P_1}{C} = k_{11}^2 A_0^2 d^2 + k_{12}^2 A_0^2 + 2 k_{11} k_{12} A_0^2 [I \cos(2\theta) - Q\sin(2\theta)] \tag{13}$$

$$\frac{P_2}{C} = k_{21}^2 A_0^2 d^2 + k_{22}^2 A_0^2 + 2 k_{21} k_{22} A_0^2 I \tag{14}$$

$$\frac{P_3}{C} = k_{12}^2 A_0^2 d^2 + k_{11}^2 A_0^2 + 2 k_{11} k_{12} A_0^2 [I \cos(2\theta) + Q\sin(2\theta)] \tag{15}$$

In the multi-port signal-IQ signal conversion circuit 1009, the baseband output signals P1, P2, and P3 obtained from equations (13), (14), and (15) are processed based on equations (16) and (17) below in the computation circuit 304 so as to be converted to demodulation signals, that is, the in-phase signal I(t) and quadrature signal Q(t) which are output to a frequency error detection circuit 106 and a baseband signal processing circuit 107:

$$I(t) = h_{i0} + h_{i1} P_1 + h_{i2} P_2 + h_{i3} P_3 \tag{16}$$

$$Q(t) = h_{q0} + h_{q1} P_1 + h_{q2} P_2 + h_{q3} P_3 \tag{17}$$

where, $$h_{i0} = 0 \tag{18}$$

$$h_{i1} = h_{i3} = \frac{1}{4 k_{11} k_{12} \cos(2\theta) - 2 k_{11}^2 - 2 k_{11}^2} \tag{19}$$

$$h_{i2} = -2 h_{i1} \frac{k_{11}^2 + k_{12}^2}{k_{21}^2} \tag{20}$$

$$h_{q0} = -\frac{1}{2 \sin(2\theta) A_0^2} \frac{k_{11}^2 - k_{12}^2}{k_{11} k_{12}} \tag{21}$$

$$h_{q1} = \frac{1}{2 \sin(2\theta) A_0^2} \frac{k_{12}^2 - k_{11} k_{12} \cos(2\theta)}{k_{11} k_{12} (2 k_{11} k_{12} \cos(2\theta) - k_{11}^2 - k_{12}^2)} \tag{22}$$

$$h_{q2} = -\frac{1}{2 \sin(2\theta) A_0^2} \frac{(k_{11}^2 - k_{12}^2) \cos(2\theta)}{k_{21}^2 k_{12} \cos(2\theta) - k_{11}^2 - k_{12}^2} \tag{23}$$

$$h_{q3} = \frac{1}{2 \sin(2\theta) A_0^2} \frac{k_{11} k_{12} \cos(2\theta) - k_{11}^2}{k_{11} k_{12} (2 k_{11} k_{12} \cos(2\theta) - k_{11}^2 - k_{12}^2)} \tag{24}$$

$$k_{ij} = \sqrt{C k_{ij}} \tag{25}$$

As explained above, according to the circuit of the present invention, demodulation signals I and Q can be obtained from a reception signal.

Further, an amplitude component d of the reception signal can be found from the equation below:

$$d^2 = \frac{P_2}{k_{21}^2 A_0^2} - 1 - 2I \tag{26}$$

Accordingly, an average signal power can be found from a time average of equation (26). The average signal power is calculated in an average signal power computation circuit 102 receiving output detection signals P1, P2, and P3 from the power detection circuits 1006, 1007, and 1008, and the result is output as a signal S102 to the gain control signal generation circuit 105.

In the gain control signal generation circuit 105, a control signal S105 is output to the variable gain circuit 104 so that the level of the reception signal input to the multi-port demodulator 101 becomes constant based on the average power signal S102 found in the average signal power computation circuit 102.

In the variable gain circuit 104, the level of the reception signal received by a not shown antenna element via a pre-select RF filter and a low noise amplifier is adjusted to a level in accordance with the control signal S105 from the gain control signal generation circuit 105 and supplied to the multi-port demodulator 101.

Further, in the frequency error detection circuit 106 receiving the output demodulation signals I and Q from the multi-port demodulator 101, a frequency error is detected from the signals I and Q and supplied as a signal S106 to the local signal generation circuit 103.

In the local signal generation circuit 103, the frequency error value signal S106 detected in the frequency error detection circuit 106 is received, a local signal SO having an approximately equal oscillation frequency to a reception signal frequency is generated and supplied to the multi-port demodulator 101.

As explained above, according to the present embodiment, since the multi-port demodulator 101 is configured by connecting in cascade a two-terminal first phase shifter 1004, a three-terminal second branch circuit 1002, a two-terminal second phase shifter 1005, and a three-terminal third branch circuit 1003 between a first signal input terminal TINSr for a reception signal and a second signal input terminal TINSlo for a local signal, connecting the first power detection circuit 1006 to a third terminal c of the first branch circuit 1001, connecting the second power detection circuit 1006 to a third terminal c of the second branch circuit 1002, connecting the third power detection circuit 108 to a third terminal c of the third branch circuit 1003, and including an N-port signal-IQ signal conversion circuit 1009 for receiving the output signals P1, P2, and P3 of the first to third power detection circuits 1006 to 1008 and converting them to demodulation signals, that is, the in-phase signal I(t) and quadrature signal Q(t), by a computation circuit, not only are the characteristics of a multi-port mode demodulator, that is, the broadband characteristics and reduction of local signal power, contributed to, but also there are the following characteristics compared with a conventional multi-port demodulator.

Namely, compared with conventional multi-port demodulators, further broadband characteristics, lower distortion characteristics, and lower power consumption can be realized, and a high performance receiver having small fluctuations in characteristics with respect to fluctuations in temperature and fluctuations over time can be realized.

Figure 12:
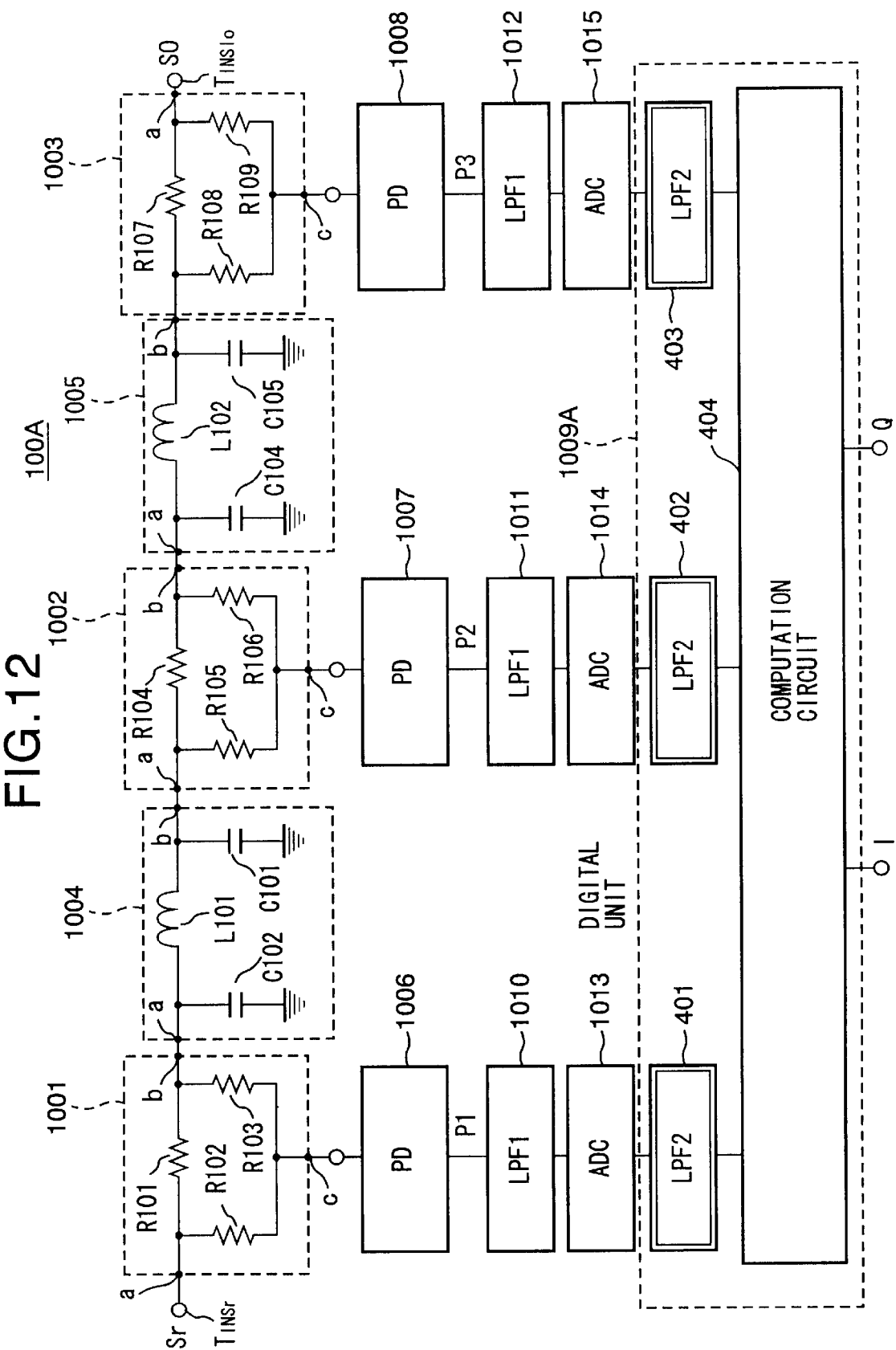
FIG. 12 is a block diagram of other embodiment of a multi-port demodulator according to the present invention.

FIG. 12 is a block diagram of another embodiment of a multi-port demodulator according to the present invention.

In FIG. 12, the same components as those in the multi-port demodulator in FIG. 7 are indicated by the same reference numerals.

The different point of the multi-port demodulator 101A in FIG. 12 and the multi-port demodulator 101 in FIG. 7 is that processing of a multi-port signal-IQ signal conversion circuit 1009A is performed by digital signal processing not by analog processing.

Specifically, as shown in FIG. 12, the outputs of the first power detection circuit 1006, the second power detection circuit 1007, and the third power detection circuit 1008 have connected to them the first LPF 1010, the second LPF 1011, and the third LPF 1012 for removing the high band signals from the baseband signal P1, P2, and P3, while the outputs of the LPF 1010, 1011, and 1012 have connected to them a first analog/digital converter (ADC) 1013, a second ADC 1014, and a third ADC 1015 for converting an analog signal to a digital signal under an appropriate sampling frequency.

The output digital signals of the first to third ADCs 1013, 1014, and 1015 are input to inputs of the digital multi-port signal-IQ signal conversion circuit 1009A.

Note that the LPFs 1010, 1011, and 1012 are provided for preventing aliasing occurring in the ADCs 1013, 1014, and 1015.

The multi-port signal-IQ signal conversion circuit 1009A is comprised of first to third digital LPFs 401, 402, and 403 serving as channel selection means for taking out only desired signals from the digital baseband signals from the ADCs 1013, 1014, and 1015 and removing other channel signals and a computation circuit 404 for receiving output signals P1', P2' and P3' from the digital LPFs 401, 402, and 403, performing calculations based on the above equations (1) and (2), and converting to demodulation signals, that is, an in-phase signal I(t) and quadrature signal Q(t).

Note that the digital multi-port signal-IQ signal conversion circuit 1009A can be realized by a DSP, FPGA, logic circuit, etc.

Figure 13:
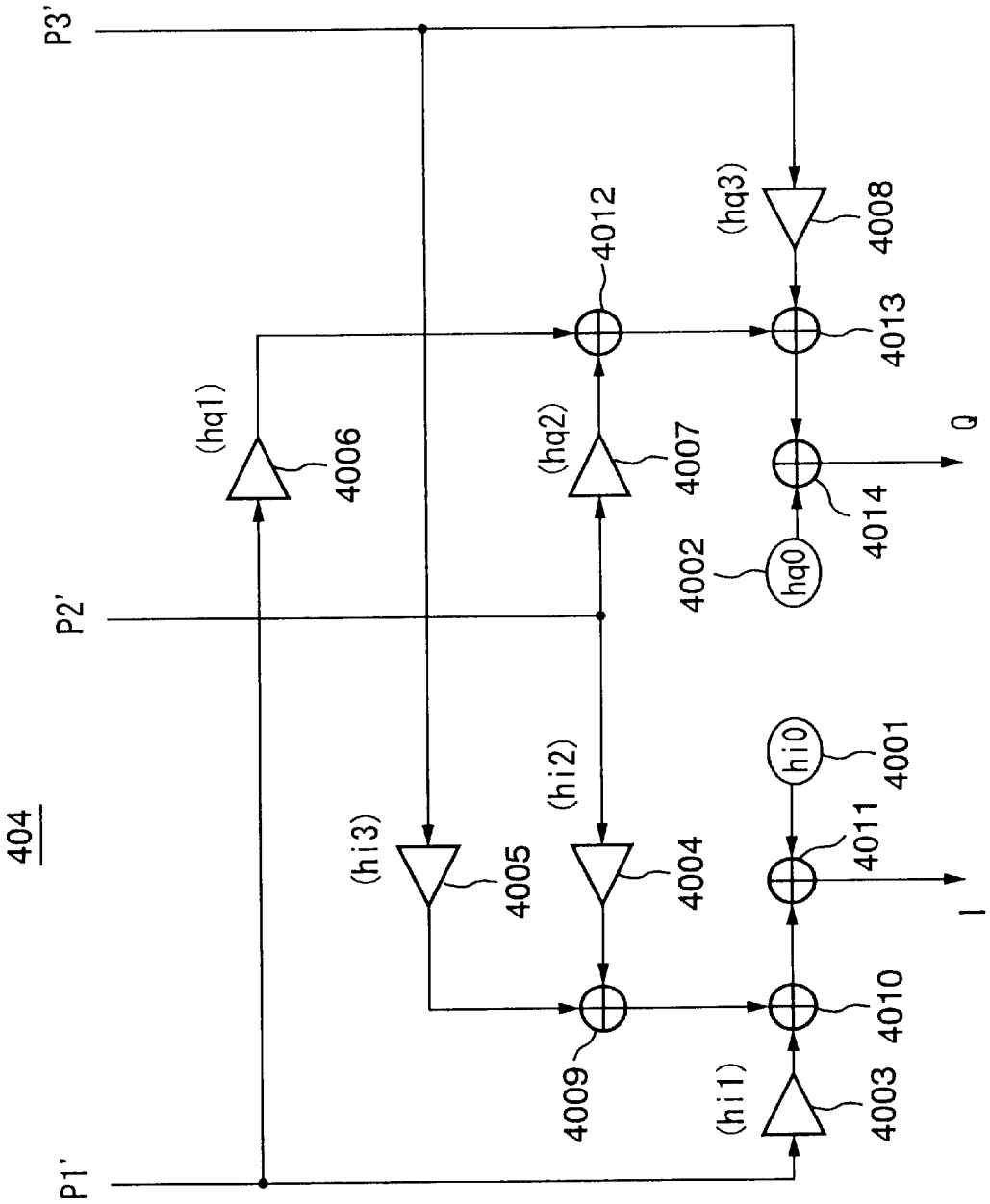
FIG. 13 is a circuit diagram of an example of the configuration of a computation circuit in a multi-port signal-IQ signal conversion circuit in FIG. 12.

FIG. 13 is a circuit diagram of an example of the configuration of a computation circuit in the multi-port signal-IQ signal conversion circuit in FIG. 12.

The computation circuit 404 comprises, as shown in FIG. 13, a coefficient $h_{i0}$ generator 4001, a coefficient $h_{q0}$ generator 4002, a coefficient $h_{i1}$ multiplier 4003, a coefficient $h_{i2}$ multiplier 4004, a coefficient $h_{i3}$ multiplier 4005, a coefficient $h_{q1}$ multiplier 4006, a coefficient $h_{q2}$ multiplier 4007, a coefficient $h_{q3}$ multiplier 4008, and adders 4009 to 4014.

In the computation circuit 404, a digital signal P1' whose channel is selected by the LPF 401 is multiplied with a coefficient $h_{i1}$ in the multiplier 4003 and the multiplication result $h_{i1}P_1$ is supplied to the adder 4010. Further, the digital signal P1' whose channel is selected by the LPF 401 is multiplied with a coefficient $h_{q1}$ in the multiplier 4006 and the multiplication result $h_{q1}P_1$ is supplied to the adder 4012.

Further, a digital signal P2' whose channel is selected by the LPF 402 is multiplied with a coefficient $h_{i2}$ in the multiplier 4004 and the multiplication result $h_{i2}P_2$ is supplied to the adder 4009. Further, the digital signal P2' whose channel is selected by the LPF 402 is multiplied with a coefficient $h_{q2}$ in the multiplier 4007 and the multiplication result $h_{q2}P_2$ is supplied to the adder 4012.

Further, a digital signal P3' whose channel is selected by the LPF 403 is multiplied with a coefficient $h_{i3}$ in the multiplier 4005 and the multiplication result $h_{i3}P_3$ is supplied to the adder 4009. Further, the digital signal P3' whose channel is selected by the LPF 403 is multiplied with a coefficient $h_{q3}$ in the multiplier 4008 and the multiplication result $h_{q3}P_3$ is supplied to the adder 4013.

In the adder 4009, the output $h_{i2}P_2$ of the multiplier 4004 and the output $h_{i3}P_3$ of the multiplier 4005 are added and the result $(h_{i2}P_2+h_{i3}P_3)$ is supplied to the adder 4010. In the adder 4010, the output $h_{i1}P_1$ of the adder 4003 and the output $(h_{i2}P_2+h_{i3}P_3)$ of the adder 4009 are added and the result $(h_{i1}P_1+h_{i2}P_2+h_{i3}P_3)$ is supplied to the adder 4011. In the adder 4011, a coefficient $h_{i0}$ from the coefficient $h_{i0}$ generator 4001 and the output $(h_{i1}P_1+h_{i2}P_2+h_{i3}P_3)$ of the adder 4010 are added and an in-phase signal $I(t)=h_{i0}+h_{i1}P_1+h_{i2}P_2+h_{i3}P_3$ indicated in the above equation (1) is obtained.

On the other hand, in the adder 4012, the output $h_{q2}P_1$ of the multiplier 4006 and the output $h_{q3}P_2$ of the multiplier 4007 are added and the result $(h_{q1P1}+h_{q2}P_2)$ is supplied to the adder 4013. In the adder 4013, the output $h_{q3}P_3$ of the adder 4008 and the output $(h_{q1P1}+h_{q2}P_2)$ of the adder 4012 are added and the result $(h_{q1P1}+h_{q2}P_2+h_{q3}P_3)$ is supplied to the adder 4014. Then, in the adder 4014, the coefficient $h_{q0}$ from the coefficient $h_{q0}$ generator 4002 and the output $(h_{q1P1}+h_{q2}P_2+h_{q3}P_3)$ of the adder 4013 are added and a quadrature signal $Q(t)=h_{q0}+h_{q1P1}+h_{q2}P_2+h_{q3}P_3$ indicated in the above equation (2) is obtained.

According to the multiport demodulator 101A, there is the advantage of realizing a low power consumption, low distortion, broadband characteristics, and high performance demodulation.

Note that, in the embodiment in FIG. 12, an example of using two low pass filters, a LPF1 and a digital LPF2, was explained, but the LPF1 in the former stage of the ADC may also perform channel select filtering in the analog region. In this case, the LPF2 becomes unnecessary.

Further, in the above explained embodiment, as shown in FIG. 8 and FIG. 12, an example where a resistance branch circuit is used as a branch circuit and a n-type LC phase shifter is used as a phase shifter was explained, but the present invention is not limited to this. Various modifications are possible of course.

Figure 14:
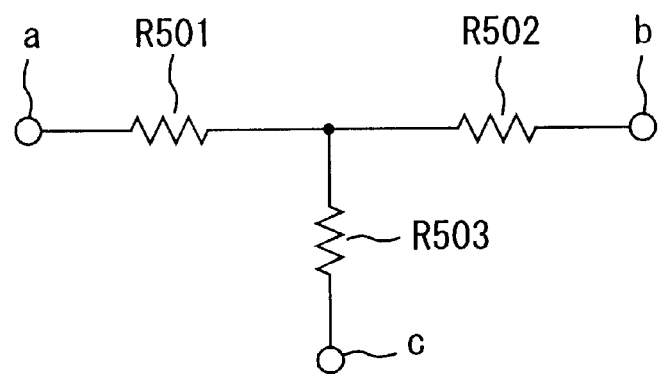
FIG. 14 is a view of an example of a T-type resistance branch circuit able to be applied to a multi-port demodulator according to the present invention.
Figure 15:
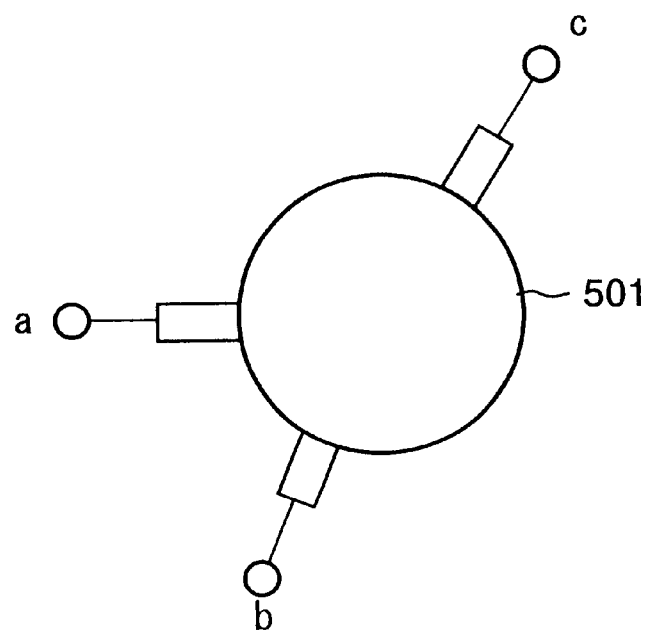
FIG. 15 is a view of a branch circuit comprised of a microstrip patch type distributed constant circuit able to be applied to the multi-port demodulator according to the present invention.
Figure 16:
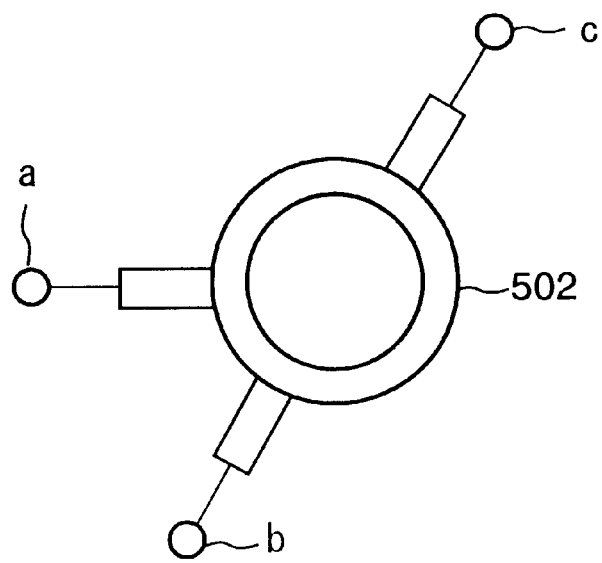
FIG. 16 is a view of a branch circuit comprised of microstrip ring type distributed constant circuit able to be applied to the multi-port demodulator according to the present invention.
Figure 17:
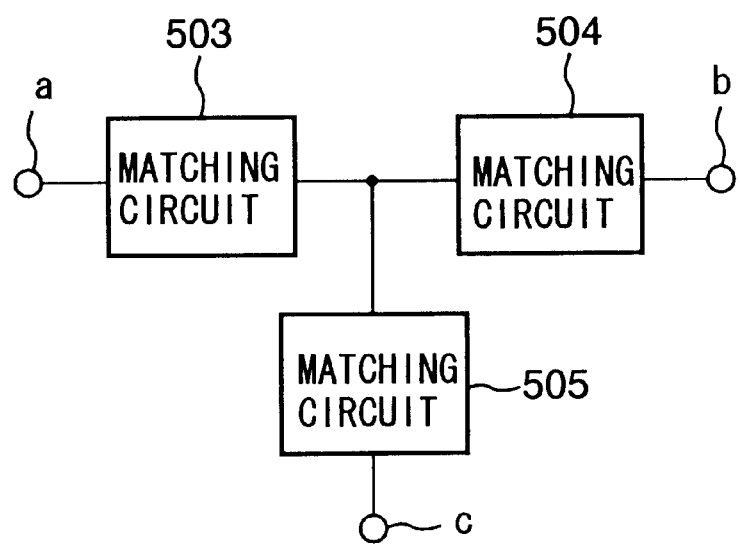
FIG. 17 is a view of a branch circuit comprising three matching circuits arranged in a T-shape able to be applied to the multi-port demodulator according to the present invention.

For example, as a branch circuit, a T-type resistance branch circuit comprised of three resistance elements R501 to R503 arranged in a T-shape as shown in FIG. 14, a circuit using a microstrip patch type distribution constant circuit 501 as shown in FIG. 15, a circuit using a microstrip ring type distribution constant circuit 502 as shown in FIG. 16, or a circuit comprised of three matching circuits 503, 504, and 505 arranged in a T-shape as shown in FIG. 17 can be used.

Further, the phase shifter can be replaced by a variety of phase shifters such as a T-type LC phase shifter, a transmission line type, an RC phase shifter, etc.

INDUSTRIAL APPLICABILITY

As explained above, according to a demodulator according to the present invention and a receiver using the same, it is possible to not only contribute to the characteristics of multi-port mode demodulators, that is, broadband characteristics and reduction of local signal power, but also to realize further broadband characteristics, low distortion characteristics, and low power consumption compared with conventional multi-port demodulators and to realize a high performance demodulator and receiver having smaller fluctuations in characteristics with respect to fluctuations in temperature and fluctuations over time.

What is claimed is:

1. A demodulator comprising:
   a first signal input terminal for receiving as an input a reception signal;
   a second signal input terminal for receiving as an input a local signal;
   a first branch circuit having a first terminal, a second terminal, and a third terminal, wherein the first terminal is connected to the first signal input terminal, branching the reception signal input to the first terminal to a signal to the second terminal and a signal to the third terminal, and branching a signal input to the second terminal to a signal to the first terminal and a signal to the third terminal;
   a second branch circuit having a first terminal, a second terminal, and a third terminal, branching a signal input to the first terminal to a signal to the second terminal and a signal to the third terminal, and branching a signal input to the second terminal to a signal to the first terminal and a signal to the third terminal;
   a third branch circuit having a first terminal, a second terminal, and a third terminal, wherein the first terminal is connected to the second signal input terminal, branching the local signal input to the first terminal to a signal to the second terminal and a signal to the third terminal, and branching a signal input to the second terminal to a signal to the first terminal and a signal to the third terminal;
   a first phase shifter having a first terminal and a second terminal, wherein the first terminal is connected to the second terminal of the first branch circuit and the second terminal is connected to the first terminal of the second branch circuit, and shifting the phases of a signal input from the first terminal and a signal input from the second terminal and outputting them from the second terminal and the first terminal;
   a second phase shifter having a first terminal and a second terminal, wherein the first terminal is connected to the second terminal of the second branch circuit and the second terminal is connected to the second terminal of the third branch circuit, and shifting the phases of a signal input from the first terminal and a signal input from the second terminal and outputting them from the second terminal and the first terminal;
   a first signal level detection circuit having an input terminal connected to the third terminal of the first branch circuit and detecting a level of a signal output from the third terminal of the first branch circuit;
   a second signal level detection circuit having an input terminal connected to the third terminal of the second branch circuit and detecting a level of a signal output from the third terminal of the second branch circuit; and
   a third signal level detection circuit having an input terminal connected to the third terminal of the third branch circuit and detecting a level of a signal output from the third terminal of the third branch circuit.

2. A demodulator as set forth in claim 1, further comprising a conversion circuit for converting an output signal of the first signal level detection circuit, an output signal of the second signal level detection circuit, and an output signal of the third signal level detection circuit to a plurality of signal components contained in a reception signal.

3. A demodulator as set forth in claim 2, wherein the conversion circuit comprises:
   a first channel selection means for selecting a desired channel from the output signal of the first signal level detection circuit;
   a second channel selection means for selecting a desired channel from the output signal of the second signal level detection circuit;
   a third channel selection means for selecting a desired channel from the output signal of the third signal level detection circuit; and
   a computation circuit for demodulating an in-phase component signal I and a quadrature component signal Q based on an output signal of the first channel selection means, an output signal of the second channel selection means, an output signal of the third channel selection means, and a predetermined circuit parameter constant.

4. A demodulator as set forth in claim 3, wherein the computation circuit obtains an in-phase component signal I and a quadrature component signal Q by computation based on the following equations:

$$I(t) = h_{i0} + h_{i1}P_1 + h_{i2}P_2 + h_{i3}P_3$$

$$Q(t) = h_{q0} + h_{q1}P_1 + h_{q2}P_2 + h_{q3}P_3$$

where, $P_1$ is an output signal of the first channel selection means, $P_2$ is an output signal of the second channel selection means, $P_3$ is an output signal of the third channel selection means, and $h_{ik}$, $h_{qk}$, k=0, 1 2, 3 are circuit parameter constants obtained from circuit elements of the present demodulator.

5. A demodulator as set forth in claim 3, wherein at least one of the first channel selection means, the second channel selection means, and the third channel selection means includes a low pass filter.

6. A demodulator as set forth in claim 4, wherein at least one of the first channel selection means, the second channel selection means, and the third channel selection means includes a low pass filter.

7. A demodulator as set forth in claim 1, wherein at least one of the first signal level detection circuit, the second signal level detection circuit, and the third signal level detection circuit comprises:

a first field effect transistor having a gate to which an input signal is supplied;

a second field effect transistor having a source to which a source of the first field effect transistor is connected;

a first gate bias supply circuit for supplying a gate bias voltage to the gate of the first field effect transistor;

a second gate bias supply circuit for supplying a gate bias voltage to a gate of the second field effect transistor;

a current source connected to a connection point of sources of the first field effect transistor and the second field effect transistor;

a drain bias supply circuit for supplying a drain bias voltage to drains of the first field effect transistor and the second field effect transistor;

a first capacitor connected between the drain of the first field effect transistor and a reference potential; and a second capacitor connected between the drain of the second field effect transistor and a reference potential and a voltage difference between a drain voltage of the first field effect transistor and a drain voltage of the second field effect transistor is defined as a detection output.

8. A demodulator as set forth in claim 7, wherein the first field effect transistor and the second field effect transistor have substantially the same characteristics;

the drain bias supply circuit includes a first drain bias resistance element connected between the drain of the first field effect transistor and a voltage source and a second drain bias resistance element connected between the drain of the field effect transistor and a voltage source;

a resistance value of the first drain bias resistance element and a resistance value of the second drain bias resistance element are set to substantially equal values; and a capacitance value of the first capacitor and a capacitance value of the second capacitor are set to substantially equal values.

9. A demodulator as set forth in claim 8, wherein a ratio Wga/Wgb of a gate width Wga of the first field effect transistor and a gate width Wgb of the second field effect transistor is set to N;

the drain bias supply circuit includes a first drain bias resistance element connected between a drain of the first field effect transistor and a voltage source and a second drain bias resistance element connected between a drain of the second field effect transistor and a voltage source;

a resistance value Ra of the first drain bias resistance element and a resistance value Rb of the second drain bias resistance element are set so as to satisfy a condition of Ra/Rb=1/N; and a capacitance value of the first capacitor and a capacitance value of the second capacitor are set to substantially equal values.

10. A demodulator comprising:

a first signal input terminal for receiving as an input a reception signal;

a second signal input terminal for receiving as an input a local signal;

a first branch circuit having a first terminal, a second terminal, and a third terminal, wherein the first terminal is connected to the first signal input terminal, branching the reception signal input to the first terminal to a signal to the second terminal and a signal to the third terminal, and branching a signal input to the second terminal to a signal to the first terminal and a signal to the third terminal;

a second branch circuit having a first terminal, a second terminal, and a third terminal, branching a signal input to the first terminal to a signal to the second terminal and a signal to the third terminal, and branching a signal input to the second terminal to a signal to a first terminal and a signal to the third terminal;

a third branch circuit having a first terminal, a second terminal, and a third terminal, wherein the first terminal is connected to the second signal input terminal, branching the local signal input to the first terminal to a signal to the second terminal and a signal to the third terminal, and branching a signal input to the second terminal to a signal to the first terminal and a signal to the third terminal;

a first phase shifter having a first terminal and a second terminal, wherein the first terminal is connected to the second terminal of the first branch circuit and the second terminal is connected to the first terminal of the second branch circuit, and shifting the phases of a signal input from the first terminal and a signal input from the second terminal and outputting them from the second terminal and the first terminal;

a second phase shifter having a first terminal and a second terminal, wherein the first terminal is connected to the second terminal of the second branch circuit and the second terminal is connected to the second terminal of the third branch circuit, and shifting the phases of a signal input from the first terminal and a signal input from the second terminal and outputting them from the second terminal and the first terminal;

a first signal level detection circuit having an input terminal connected to the third terminal of the first branch circuit and detecting a level of a signal output from the third terminal of the first branch circuit;

a second signal level detection circuit having an input terminal connected to the third terminal of the second branch circuit and detecting a level of a signal output from the third terminal of the second branch circuit;

a third signal level detection circuit having an input terminal connected to the third terminal of the third branch circuit and detecting a level of a signal output from the third terminal of the third branch circuit;

a first analog/digital converter for converting an output signal of the first signal level detection circuit from an analog signal to a digital signal;

a second analog/digital converter for converting an output signal of the second signal level detection circuit from an analog signal to a digital signal;

a third analog/digital converter for converting an output signal of the third signal level detection circuit from an analog signal to a digital signal; and a conversion circuit for converting an output signal of the first analog/digital converter, an output signal of the second analog/digital converter, and an output signal of the third analog/digital converter to a plurality of signal components contained in a reception signal.

11. A demodulator as set forth in claim 10, further comprising:

a first filter for removing a high band component of an output signal of the first signal level detection circuit and inputting it to the first analog/digital converter;

a second filter for removing a high band component of an output signal of the second signal level detection circuit and inputting it to the second analog/digital converter; and a third filter for removing a high band component of an output signal of the third signal level detection circuit and inputting it to the third analog/digital converter; and the conversion circuit includes:
   a first channel selection means for selecting a desired channel from an output signal of the first analog/digital converter;
   a second channel selection means for selecting a desired channel from an output signal of the second analog/digital converter;
   a third channel selection means for selecting a desired channel from an output signal of the third analog/digital converter; and
   a computation circuit for demodulating an in-phase component signal I and a quadrature component signal Q based on an output signal of the first channel selection means, an output signal of the second channel selection means, an output signal of the third channel selection means, and a predetermined circuit parameter constant.

12. A demodulator as set forth in claim 11, wherein the computation circuit obtains an in-phase component signal I and a quadrature component signal Q by computation based on the following equations:

$$I(t)=h_{i0}+h_{i1}P_1+h_{i2}P_2+h_{i3}P_3$$
$$Q(t)=h_{q0}+h_{q1}P_1+h_{q2}P_2+h_{q3}P_3$$

where, $P_1$ is an output signal of the first channel selection means, $P_2$ is an output signal of the second channel selection means, $P_3$ is an output signal of the third channel selection means, and $h_{ik}$, $h_{qk}$, k=0, 1 2, 3 are circuit parameter constants obtained from circuit elements of the present demodulator.

13. A demodulator as set forth in claim 11, wherein at least one of the first channel selection means, the second channel selection means, and the third channel selection means includes a low pass filter.

14. A demodulator as set forth in claim 12, wherein at least one of the first channel selection means, second channel selection means, and third channel selection means includes a low pass filter.

15. A demodulator as set forth in claim 10, further comprising:
   a first channel selection means for selecting a desired channel from an output signal of the first signal level detection circuit and inputting it to the first analog/digital converter;
   a second channel selection means for selecting a desired channel from an output signal of the second signal level detection circuit and inputting it to the second analog/digital converter; and
   a third channel selection means for selecting a desired channel from an output signal of the third signal level detection circuit and inputting it to the third analog/digital converter; and
   the conversion circuit includes a computation circuit for demodulating an in-phase component signal I and a quadrature component signal Q based on an output digital signal of the first analog/digital converter, an output digital signal of the second analog/digital converter, an output digital signal of the third analog/digital converter, and a predetermined circuit parameter constant.

16. A demodulator as set forth in claim 15, wherein the computation circuit obtains an in-phase component signal I and a quadrature component signal Q by computation based on the following equations:

$$I(t)=h_{i0}+h_{i1}P_1+h_{i2}P_2+h_{i3}P_3$$
$$Q(t)=h_{q0}+h_{q1}P_1+h_{q2}P_2+h_{q3}P_3$$

where $P_1$ is an output signal of the first channel selection means, $P_2$ is an output signal of the second channel election means, $P_3$ is an output signal of the third channel selection means, and $h_{ik}$, $h_{qk}$, and k=0, 1 2, 3 are circuit parameter constants obtained from circuit elements of the present demodulator.

17. A demodulator as set forth in claim 15, wherein at least one of the first channel selection means, the second channel selection means, and the third channel selection means includes a low pass filter.

18. A demodulator as set forth in claim 16, wherein at least one of the first channel selection means, the second channel selection means, and the third channel selection means includes a low pass filter.

19. A demodulator as set forth in claim 10, wherein at least one of the first signal level detection circuit, the second signal level detection circuit, and the third signal level detection circuit comprises:
   a first field effect transistor having a gate to which an input signal is supplied;
   a second field effect transistor having a source to which a source of the first field effect transistor is connected;
   a first gate bias supply circuit for supplying a gate bias voltage to the gate of the first field effect transistor;
   a second gate bias supply circuit for supplying a gate bias voltage to a gate of the second field effect transistor;
   a current source connected to a connection point of sources of the first field effect transistor and the second field effect transistor;
   a drain bias supply circuit for supplying a drain bias voltage to drains of the first field effect transistor and the second field effect transistor;
   a first capacitor connected between the drain of the first field effect transistor and a reference potential; and
   a second capacitor connected between the drain of the second field effect transistor and a reference potential and a voltage difference between a drain voltage of the first field effect transistor and a drain voltage of the second field effect transistor is defined as a detection output.

20. A demodulator as set forth in claim 19, wherein
   the first field effect transistor and the second field effect transistor have substantially the same characteristics;
   the drain bias supply circuit includes a first drain bias resistance element connected between the drain of the first field effect transistor and a voltage source and a second drain bias resistance element connected between the drain of the field effect transistor and a voltage source;
   a resistance value of the first drain bias resistance element and a resistance value of the second drain bias resistance element are set to substantially equal values; and
   a capacitance value of the first capacitor and a capacitance value of the second capacitor are set to substantially equal values.

21. A demodulator as set forth in claim 19, wherein
a ratio Wga/Wgb of a gate width Wga of the first field effect transistor and a gate width Wgb of the second field effect transistor is set to N;

the drain bias supply circuit includes a first drain bias resistance element connected between a drain of the first field effect transistor and a voltage source and a second drain bias resistance element connected between a drain of the second field effect transistor and a voltage source;

a resistance value Ra of the first drain bias resistance element and a resistance value Rb of the second drain bias resistance element are set so as to satisfy a condition of Ra/Rb=1/N; and a capacitance value of the first capacitor and a capacitance value of the second capacitor are set to substantially equal values.

22. A receiver comprising:
a demodulator comprising a first signal input terminal for receiving as an input a reception signal, a second signal input terminal for receiving as an input a local signal, a first branch circuit having a first terminal, a second terminal, and a third terminal, wherein the first terminal is connected to the first signal input terminal, branching the reception signal input to the first terminal to a signal to the second terminal and a signal to the third terminal, and branching a signal input to the second terminal to a signal to the first terminal and a signal to the third terminal, a second branch circuit having a first terminal, a second terminal, and a third terminal, branching a signal input to the first terminal to a signal to the second terminal and a signal to the third terminal, and branching a signal input to the second terminal to a signal to a first terminal and a signal to the third terminal, a third branch circuit having a first terminal, a second terminal, and a third terminal, wherein the first terminal is connected to the second signal input terminal, branching the local signal input to the first terminal to a signal to the second terminal and a signal to the third terminal, and branching a signal input to the second terminal to a signal to the first terminal and a signal to the third terminal, a first phase shifter having a first terminal and a second terminal, wherein the first terminal is connected to the second terminal of the first branch circuit and the second terminal is connected to the first terminal of the second branch circuit, shifting phases of a signal input from the first terminal and a signal input from the second terminal and outputting them from the second terminal and the first terminal, a second phase shifter having a first terminal and a second terminal, wherein the first terminal is connected to the second terminal of the second branch circuit and the second terminal is connected to the second terminal of the third branch circuit, and shifting phases of a signal input from the first terminal and a signal input from the second terminal and outputting them from the second terminal and the first terminal, a first signal level detection circuit having an input terminal connected to the third terminal of the first branch circuit and detecting a level of a signal output from the third terminal of the first branch circuit, a second signal level detection circuit having an input terminal connected to the third terminal of the second branch circuit and detecting a level of a signal output from the third terminal of the second branch circuit, a third signal level detection circuit having an input terminal connected to the third terminal of the third branch circuit and detecting a level of a signal output from the third terminal of the third branch circuit, and a conversion circuit for converting an output signal of the first signal level detection circuit, an output signal of the second signal level detection circuit, and an output signal of the third signal level detection circuit to a plurality of signal components contained in a reception signal;

a gain control circuit for adjusting a level of a reception signal to a desired level and supplying the signal to the first signal input terminal of the demodulator; and a local signal generation circuit for generating a local signal at a desired oscillation frequency and supplying the signal to the second signal input terminal of the demodulator.

23. A receiver as set forth in claim 22, further comprising:
an average signal power computation circuit for receiving an output signal of the first signal level detection circuit, an output signal of the second signal level detection circuit, and an output signal of the third signal level detection circuit of the demodulator and computing an average signal power and a gain control signal generation circuit for outputting a control signal to the gain control circuit so that a level of a reception signal input to the demodulator becomes constant based on an average power obtained in the average signal power computation circuit; and the gain control circuit adjusting the input reception signal to a level in accordance with the control signal from the gain control signal generation circuit and supplying it to the first signal input terminal of the demodulator.

24. A receiver as set forth in claim 22, wherein the average signal power computation circuit obtains an average signal power by computation based on the following signal, $$\overline{d^2} = \overline{h_{d0} + h_{d1}P_1 + h_{d2}P_2 + h_{d3}P_3}$$

where, $d^2$ is a reception signal power and $h_{dk}$ and k=0, 1, 2, 3 are circuit parameter constants obtained from the circuit elements of the demodulator.

25. A receiver as set forth in claim 22, further comprising:
a frequency error detection circuit for detecting a frequency error based on a plurality of signal components obtained by a conversion circuit of the demodulator and supplying the result to the local signal generation circuit, and the local signal generation circuit setting an oscillation frequency of a local signal so as to become a substantially equal frequency to a carrier frequency of a reception signal based on a frequency error value detected in the frequency error detection circuit.

26. A receiver as set forth in claim 23, further comprising:
a frequency error detection circuit for detecting a frequency error based on a plurality of signal components obtained by a conversion circuit of the demodulator and supplying the result to the local signal generation circuit, and the local signal generation circuit setting an oscillation frequency of a local signal so as to become a substantially equal frequency to a carrier frequency of a reception signal based on a frequency error value detected in the frequency error detection circuit.

27. A receiver as set forth in claim 23, wherein the conversion circuit of the demodulator comprises:
a first channel selection means for selecting a desired channel from an output signal from the first signal level detection circuit;

a second channel selection means for selecting a desired channel from an output signal from the second signal level detection circuit;

a third channel selection means for selecting a desired channel from an output signal from the third signal level detection circuit; and a computation circuit for demodulating an in-phase component signal I and a quadrature component signal Q based on an output signal of the first channel selection means, an output signal of the second channel selection means, an output signal of the third channel selection means, and a predetermined circuit parameter constant.

28. A receiver as set forth in claim 27, wherein the computation circuit obtains an in-phase component signal I and a quadrature component signal Q by computation based on the following equations:

$$I(t)=h_{i0}+h_{i1}P_1+h_{i2}P_2+h_{i3}P_3$$

$$Q(t)=h_{q0}+h_{q1}P_1+h_{q2}P_2+h_{q3}P_3$$

where, $P_1$ is an output signal of the first channel selection means, $P_2$ is an output signal of the second channel selection means, $P_3$ is an output signal of the third channel selection means, and $h_{ik}$, $h_{qk}$, and k=0, 1 2, 3 are circuit parameter constants obtained from circuit elements of the demodulator.

29. A receiver as set forth in claim 27, further comprising:

an average signal power computation circuit for receiving an output signal of the first signal level detection circuit, an output signal of the second signal level detection circuit, and an output signal of the third signal level detection circuit of the demodulator and computing an average signal power and a gain control signal generation circuit for outputting a control signal to the gain control circuit so that a level of a reception signal input to the demodulator becomes constant based on an average power obtained in the average signal power computation circuit; and the gain control circuit adjusting the input reception signal to a level in accordance with the control signal from the gain control signal generation circuit and supplying it to the first signal input terminal of the demodulator.

30. A receiver as set forth in claim 29, wherein the average signal power computation circuit obtains an average signal power by computation based on the following signal, $$d^2=h_{d0}+h_{d1}P_1+h_{d2}P_2+h_{d3}P_3$$

where, $d^2$ is a reception signal power and $h_{dk}$ and k=0, 1, 2, 3 are circuit parameter constants obtained from the circuit elements of the demodulator.

31. A receiver as set forth in claim 27, further comprising:

a frequency error detection circuit for detecting a frequency error based on an in-phase component signal I and a quadrature component signal Q obtained by a conversion circuit of the demodulator and supplying the result to the local signal generation circuit, and the local signal generation circuit setting an oscillation frequency of a local signal so as to become a substantially equal frequency to a carrier frequency of a reception signal based on a frequency error value detected in the frequency error detection circuit.

32. A receiver as set forth in claim 29, further comprising:

a frequency error detection circuit for detecting a frequency error based on an in-phase component signal I and a quadrature component signal Q obtained by a conversion circuit of the demodulator and supplying the result to the local signal generation circuit, the local signal generation circuit setting an oscillation frequency of a local signal so as to become a substantially equal frequency to a carrier frequency of a reception signal based on a frequency error value detected in the frequency error detection circuit.

33. A receiver as set forth in claim 27, wherein at least one of the first channel selection means, the second channel selection means, and the third channel selection means includes a low pass filter.

34. A receiver as set forth in claim 28, wherein at least one of the first channel selection means, the second channel selection means, and the third channel selection means includes a low pass filter.

35. A receiver as set forth in claim 22, wherein at least one of the first signal level detection circuit, the second signal level detection circuit, and the third signal level detection circuit comprises:

a first field effect transistor having a gate to which an input signal is supplied;

a second field effect transistor having a source to which a source of the first field effect transistor is connected;

a first gate bias supply circuit for supplying a gate bias voltage to the gate of the first field effect transistor;

a second gate bias supply circuit for supplying a gate bias voltage to a gate of the second field effect transistor;

a current source connected to a connection point of sources of the first field effect transistor and the second field effect transistor;

a drain bias supply circuit for supplying a drain bias voltage to drains of the first field effect transistor and the second field effect transistor;

a first capacitor connected between the drain of the first field effect transistor and the reference potential; and a second capacitor connected between the drain of the second field effect transistor and the reference potential and a voltage difference between a drain voltage of the first field effect transistor and a drain voltage of the second field effect transistor is defined as a detection output.

36. A receiver as set forth in claim 35, wherein the first field effect transistor and the second field effect transistor have substantially the same characteristics;

the drain bias supply circuit includes a first drain bias resistance element connected between the drain of the first field effect transistor and a voltage source and a second drain bias resistance element connected between the drain of the field effect transistor and a voltage source;

a resistance value of the first drain bias resistance element and a resistance value of the second drain bias resistance element are set to substantially equal values; and a capacitance value of the first capacitor and a capacitance value of the second capacitor are set to substantially equal values.

37. A receiver as set forth in claim 35, wherein a ratio Wga/Wgb of a gate width Wga of the first field effect transistor and a gate width Wgb of the second field effect transistor is set to N;

the drain bias supply circuit includes a first drain bias resistance element connected between a drain of the first field effect transistor and a voltage source and a second drain bias resistance element connected between a drain of the second field effect transistor and a voltage source;

a resistance value Ra of the first drain bias resistance element and a resistance value Rb of the second drain bias resistance element are set so as to satisfy a condition of Ra/Rb=1/N; and a capacitance value of the first capacitor and a capacitance value of the second capacitor are set to substantially equal values.

38. A receiver comprising:

a demodulator comprising a first signal input terminal for receiving as an input a reception signal, a second signal input terminal for receiving as an input a local signal, a first branch circuit having a first terminal, a second terminal, and a third terminal, wherein the first terminal is connected to the first signal input terminal, branching the reception signal input to the first terminal to a signal to the second terminal and a signal to the third terminal, and branching a signal input to the second terminal to a signal to the first terminal and a signal to the third terminal, a second branch circuit having a first terminal, a second terminal, and a third terminal, wherein a signal input to the first terminal is branched to a signal to the second terminal and a signal to the third terminal, and branching a signal input to the second terminal to a signal to a first terminal and a signal to the third terminal, a third branch circuit having a first terminal, a second terminal, and a third terminal, wherein the first terminal is connected to the second signal input terminal, branching the local signal input to the first terminal to a signal to the second terminal and a signal to the third terminal, and branching a signal input to the second terminal to a signal to the first terminal and a signal to the third terminal, a first phase shifter having a first terminal and a second terminal, wherein the first terminal is connected to the second terminal of the first branch circuit, and the second terminal is connected to the first terminal of the second branch circuit, and shifting the phases of a signal input from the first terminal and a signal input from the second terminal and output them from the second terminal and the first terminal, a second phase shifter having a first terminal and a second terminal, wherein the first terminal is connected to the second terminal of the second branch circuit, and the second terminal is connected to the second terminal of the third branch circuit, and shifting the phases of a signal input from the first terminal and a signal input from the second terminal and outputting them from the second terminal and the first terminal, a first signal level detection circuit having an input terminal connected to the third terminal of the first branch circuit and detecting a level of a signal output from the third terminal of the first branch circuit, a second signal level detection circuit having an input terminal connected to the third terminal of the second branch circuit and detecting a level of a signal output from the third terminal of the second branch circuit, a third signal level detection circuit having an input terminal connected to the third terminal of the third branch circuit and detecting a level of a signal output from the third terminal of the third branch circuit, a first analog/digital converter for converting an output signal of the first signal level detection circuit from an analog signal to a digital signal, a second analog/digital converter for converting an output signal of the second signal level detection circuit from an analog signal to a digital signal, a third analog/digital converter for converting an output signal of the third signal level detection circuit from an analog signal to a digital signal, and a conversion circuit for converting an output signal of the first analog/digital converter, an output signal of the second analog/digital converter, and an output signal of the third analog/digital converter to a plurality of signal components contained in a reception signal;

a gain control circuit for adjusting a level of a reception signal to a desired level and supplying it to the first signal input terminal of the demodulator; and a local signal generation circuit for generating a local signal at a desired oscillation frequency and supplying it to the second signal input terminal of the demodulator.

39. A receiver as set forth in claim 38 further comprising:

an average signal power computation circuit for receiving an output signal of the first signal level detection circuit, an output signal of the second signal level detection circuit, and an output signal of the third signal level detection circuit of the demodulator and computing an average signal power and a gain control signal generation circuit for outputting a control signal to the gain control circuit so that a level of a reception signal input to the demodulator becomes constant based on an average power obtained in the average signal power computation circuit; and the gain control circuit adjusting the input reception signal to a level in accordance with the control signal from the gain control signal generation circuit and supplying it to the first signal input terminal of the demodulator.

40. A receiver as set forth in claim 39, wherein the average signal power computation circuit obtains an average signal power by computation based on the following signal, $$\overline{d^2} = \overline{h_{d0} + h_{d1}P_1 + h_{d2}P_2 + h_{d3}P_3}$$

where, $d^2$ is a reception signal power and $h_{dk}$ and $k=0, 1, 2, 3$ are circuit parameter constants obtained from the circuit elements of the demodulator.

41. A receiver as set forth in claim 38, further comprising:

a frequency error detection circuit for detecting a frequency error based on a plurality of signal components obtained by a conversion circuit of the demodulator and supplying the result to the local signal generation circuit, and the local signal generation circuit setting an oscillation frequency of a local signal so as to become a substantially equal frequency to a carrier frequency of a reception signal based on a frequency error value detected in the frequency error detection circuit.

42. A receiver as set forth in claim 39, further comprising:

a frequency error detection circuit for detecting a frequency error based on a plurality of signal components obtained by a conversion circuit of the demodulator and supplying the result to the local signal generation circuit, and the local signal generation circuit setting an oscillation frequency of a local signal so as to become a substantially equal frequency to a carrier frequency of a reception signal based on a frequency error value detected in the frequency error detection circuit.

43. A receiver as set forth in claim 38, wherein the demodulator further comprises:

a first filter for removing a high band component of an output signal of the first signal level detection circuit and inputting it to the first analog/digital converter;

a second filter for removing a high band component of an output signal of the second signal level detection circuit and inputting it to the second analog/digital converter; and a third filter for removing a high band component of an output signal of the third signal level detection circuit and inputting it to the third analog/digital converter; and the conversion circuit includes:
- a first channel selection means for selecting a desired channel from an output signal of the first analog/digital converter;
- a second channel selection means for selecting a desired channel from an output signal of the second analog/digital converter;
- a third channel selection means for selecting a desired channel from an output signal of the third analog/digital converter; and
- a computation circuit for demodulating an in-phase component signal I and a quadrature component signal Q based on an output signal of the first channel selection means, an output signal of the second channel selection means, an output signal of the third channel selection means, and a predetermined circuit parameter constant.

44. A receiver as set forth in claim 43, wherein the computation circuit obtains an in-phase component signal I and a quadrature component signal Q by computation based on the following equations:

$$I(t)=h_{i0}+h_{i1}P_1+h_{i2}P_2+h_{i3}P_3$$

$$Q(t)=h_{q0}+h_{q1}P_1+h_{q2}P_2+h_{q3}P_3$$

where, $P_1$ is an output signal of the first channel selection means, $P_2$ is an output signal of the second channel selection means, $P_3$ is an output signal of the third channel selection means, and $h_{ik}$, $h_{qk}$, k=0, 1 2, 3 are circuit parameter constants obtained from circuit elements of the demodulator.

45. A receiver as set forth in claim 44 further comprising:
- an average signal power computation circuit for receiving an output signal of the first signal level detection circuit, an output signal of the second signal level detection circuit, and an output signal of the third signal level detection circuit of the demodulator and computing an average signal power and
- a gain control signal generation circuit for outputting a control signal to the gain control circuit so that a level of a reception signal input to the demodulator becomes constant based on an average power obtained in the average signal power computation circuit; and
- the gain control circuit adjusting the input reception signal to a level in accordance with the control signal from the gain control signal generation circuit and supplying it to the first signal input terminal of the demodulator.

46. A receiver as set forth in claim 45, wherein the average signal power computation circuit obtains an average signal power by computation based on the following signal, $$\overline{d^2}=h_{d0}+h_{d1}P_1+h_{d2}P_2+h_{d3}P_3$$

where, $d^2$ is a reception signal power and $h_{dk}$ and k=0, 1, 2, 3 are circuit parameter constants obtained from the circuit elements of the demodulator.

47. A receiver as set forth in claim 43, further comprising:
- a frequency error detection circuit for detecting a frequency error based on an in-phase component signal I and a quadrature component signal Q obtained by a conversion circuit of the demodulator and supplying the result to the local signal generation circuit, and
- the local signal generation circuit setting an oscillation frequency of a local signal so as to become a substantially equal frequency to a carrier frequency of a reception signal based on a frequency error value detected in the frequency error detection circuit.

48. A receiver as set forth in claim 45, further comprising:
- a frequency error detection circuit for detecting a frequency error based on an in-phase component signal I and a quadrature component signal Q obtained by a conversion circuit of the demodulator and supplying the result to the local signal generation circuit, and
- the local signal generation circuit setting an oscillation frequency of a local signal so as to become a substantially equal frequency to a carrier frequency of a reception signal based on a frequency error value detected in the frequency error detection circuit.

49. A receiver as set forth in claim 43, wherein at least one of the first channel selection means, the second channel selection means, and the third channel selection means includes a low pass filter.

50. A receiver as set forth in claim 44, wherein at least one of the first channel selection means, the second channel selection means, and the third channel selection means includes a low pass filter.

51. A receiver as set forth in claim 38, further comprising:
- a first channel selection means for selecting a desired channel from an output signal of the first signal level detection circuit and inputting it to the first analog/digital converter;
- a second channel selection means for selecting a desired channel from an output signal of the second signal level detection circuit and inputting it to the second analog/digital converter; and
- a third channel selection means for selecting a desired channel from an output signal of the third signal level detection circuit and inputting it to the third analog/digital converter;
- the conversion circuit including a computation circuit for demodulating an in-phase component signal I and a quadrature component signal Q based on an output digital signal of the first analog/digital converter, an output digital signal of the second analog/digital converter, an output digital signal of the third analog/digital converter, and a predetermined circuit parameter constant.

52. A receiver as set forth in claim 51, wherein the computation circuit obtains an in-phase component signal I and a quadrature component signal Q by computation based on the following equations:

$$I(t)=h_{i0}+h_{i1}P_1+h_{i2}P_2+h_{i3}P_3$$

$$Q(t)=h_{q0}+h_{q1}P_1+h_{q2}P_2+h_{q3}P_3$$

where, $P_1$ is an output signal of the first channel selection means, $P_2$ is an output signal of the second channel selection means, $P_3$ is an output signal of the third channel selection means, and $h_{ik}$, $h_{qk}$, k=0, 1 2, 3 are circuit parameter constants obtained from circuit elements of the demodulator.

53. A receiver as set forth in claim 51 further comprising:
an average signal power computation circuit for receiving an output signal of the first signal level detection circuit, an output signal of the second signal level detection circuit, and an output signal of the third signal level detection circuit of the demodulator and computing an average signal power and a gain control signal generation circuit for outputting a control signal to the gain control circuit so that a level of a reception signal input to the demodulator becomes constant based on an average power obtained in the average signal power computation circuit; and the gain control circuit adjusting the input reception signal to a level in accordance with the control signal from the gain control signal generation circuit and supplying it to the first signal input terminal of the demodulator.

54. A receiver as set forth in claim 53, wherein the average signal power computation circuit obtains an average signal power by computation based on the following signal $$\overline{d^2} = \overline{h_{d0} + h_{d1}P_1 + h_{d2}P_2 + h_{d3}P_3}$$

where, $d^2$ is a reception signal power and $h_{dk}$ and k=0, 1, 2, 3 are circuit parameter constants obtained from the circuit elements of the demodulator.

55. A receiver as set forth in claim 51, further comprising:

a frequency error detection circuit for detecting a frequency error based on an in-phase component signal I and a quadrature component signal Q obtained by a conversion circuit of the demodulator and supplying the result to the local signal generation circuit, and the local signal generation circuit setting an oscillation frequency of a local signal so as to become a substantially equal frequency to a carrier frequency of a reception signal based on a frequency error value detected in the frequency error detection circuit.

56. A receiver as set forth in claim 53, further comprising:

a frequency error detection circuit for detecting a frequency error based on an in-phase component signal I and a quadrature component signal Q obtained by a conversion circuit of the demodulator and supplying the result to the local signal generation circuit, and the local signal generation circuit setting an oscillation frequency of a local signal so as to become a substantially equal frequency to a carrier frequency of a reception signal based on a frequency error value detected in the frequency error detection circuit.

57. A receiver as set forth in claim 51, wherein at least one of the first channel selection means, the second channel selection means, and the third channel selection means includes a low pass filter.

58. A receiver as set forth in claim 52, wherein at least one of the first channel selection means, the second channel selection means, and the third channel selection means includes a low pass filter.

59. A receiver as set forth in claim 38, wherein at least one of the first signal level detection circuit, the second signal level detection circuit, and the third signal level detection circuit comprises:

a first field effect transistor having a gate to which an input signal is supplied;

a second field effect transistor having a source to which a source of the first field effect transistor is connected;

a first gate bias supply circuit for supplying a gate bias voltage to the gate of the first field effect transistor;

a second gate bias supply circuit for supplying a gate bias voltage to a gate of the second field effect transistor;

a current source connected to a connection point of sources of the first field effect transistor and second field effect transistor;

a drain bias supply circuit for supplying a drain bias voltage to drains of the first field effect transistor and the second field effect transistor;

a first capacitor connected between the drain of the first field effect transistor and a reference potential; and a second capacitor connected between the drain of the second field effect transistor and the reference potential and a voltage difference between a drain voltage of the first field effect transistor and a drain voltage of the second field effect transistor is defined as a detection output.

60. A receiver as set forth in claim 59, wherein the first field effect transistor and second field effect transistor have substantially the same characteristics;

the drain bias supply circuit includes a first drain bias resistance element connected between the drain of the first field effect transistor and a voltage source and a second drain bias resistance element connected between the drain of the field effect transistor and a voltage source;

a resistance value of the first drain bias resistance element and a resistance value of the second drain bias resistance element are set to substantially equal values; and a capacitance value of the first capacitor and a capacitance value of the second capacitor are set to substantially equal values.

61. A receiver as set forth in claim 59, wherein a ratio Wga/Wgb of a gate width Wga of the first field effect transistor and a gate width Wgb of the second field effect transistor is set to N;

the drain bias supply circuit includes a first drain bias resistance element connected between a drain of the first field effect transistor and a voltage source and a second drain bias resistance element connected between a drain of the second field effect transistor and a voltage source;

a resistance value Ra of the first drain bias resistance element and a resistance value Rb of the second drain bias resistance element are set so as to satisfy a condition of Ra/Rb=1/N; and a capacitance value of the first capacitor and a capacitance value of the second capacitor are set to substantially equal values.

* * * * *